United States Patent [19]
Shirahata et al.

[11] Patent Number: 5,594,264
[45] Date of Patent: Jan. 14, 1997

[54] LDD SEMICONDUCTOR DEVICE WITH PEAK IMPURITY CONCENTRATIONS

[75] Inventors: Masayoshi Shirahata; Yoshinori Okumura, both of Hyogo, Japan

[73] Assignee: Mitsubishi Denki Kabushiki Kaisha, Tokyo, Japan

[21] Appl. No.: 528,564

[22] Filed: Sep. 15, 1995

[30] Foreign Application Priority Data

Dec. 16, 1994 [JP] Japan .................................. 6-313395

[51] Int. Cl.⁶ .................................. H01L 27/088
[52] U.S. Cl. .................. 257/335; 257/336; 257/344; 257/371; 257/408
[58] Field of Search ............................ 257/408, 336, 257/344, 371, 335, 368, 403, 900

[56] References Cited

U.S. PATENT DOCUMENTS

| | | | |
|---|---|---|---|
| 4,242,691 | 12/1980 | Kotani et al. | 357/23 |
| 4,819,043 | 4/1989 | Yazawa et al. | 257/344 X |
| 5,463,237 | 10/1995 | Funaki | 257/408 X |

FOREIGN PATENT DOCUMENTS

| | | | |
|---|---|---|---|
| 0073623 | 3/1983 | European Pat. Off. | 257/336 |
| 6464364 | 3/1989 | Japan | 257/408 |
| 1120067 | 5/1989 | Japan | 257/344 |
| 3256355 | 11/1991 | Japan | 257/408 |
| 5335568 | 12/1993 | Japan | 257/344 |

OTHER PUBLICATIONS

1992 ICSSDM, pp. 695–696, 1992, R. Nagai, et al., "Low Voltage, High Gain, 0.2 um NMOSFETs by Channel Counter Doping With AS".

1994 ICSSDM, pp. 509–511, 1994, E. P. Ver Ploeg, et al., "Mobility Improvement By Counter Doping and Its Reverse Short Channel Effect Associated Channel–Length–Dependent Degradation".

1985 Symp. VLSI Tech., Digest of Tech. Papers, vol. 3, pp. 310–311, 1985, S. Wolf, "Silicon Processing For the VLSI Era".

*Primary Examiner*—William Mintel
*Attorney, Agent, or Firm*—Oblon, Spivak, McClelland, Maier & Neustadt, P.C.

[57] ABSTRACT

A semiconductor device includes a p-type semiconductor layer, a punch-through stopper layer having a positive impurity concentration and formed on an upper side of the p-type semiconductor layer, a buried layer formed on an upper surface of the punch-through stopper layer in a channel region, N-type source and drain regions of an LDD construction sandwiching the buried layer therebetween, a gate oxide film formed on the buried layer, and a gate electrode opposed to the buried layer, with a gate oxide film therebetween, wherein the punch-through stopper layer is shallower than the drain region.

5 Claims, 37 Drawing Sheets

LDD SEMICONDUCTOR DEVICE WITH PEAK IMPURITY CONCENTRATIONS

BACKGROUND OF THE INVENTION

1. Field of the Invention

The present invention relates to increase in performance of MOS transistors.

2. Description of the Background Art

With higher integration of LSI circuits, the gate length of MOS transistors which are constituents of the LSI circuit has been reduced, and MOS transistors having a gate length of 0.25 µm or less are becoming commercially practical. Such a short gate length causes punch-through to be pronounced, that is, a drain depletion layer extending into a source results in a leak current flow independently of gate control.

To prevent such punch-through, a higher impurity concentration between the source and drain is required so as to prevent extension of the drain depletion layer. However, the increase in the impurity concentration increases a threshold voltage ($V_{th}$) of the MOS transistors.

High-performance LSI circuits which operate at low voltages are required in the field of portable equipments for which market expansion is expected in the future. FIG. 38 is a graph plotting circuit delay versus threshold voltage for various power supply voltages $V_{DD}$ in a circuit including an odd number of series-connected three-input NAND gates formed by MOS transistors (R. H. Dennard, et al., "Power-Supply Considerations For Future Scaled CMOS Systems", 1987 Symposium on VLSI Technology, Systems and Applications, Taipei, Taiwan, P.188). It is apparent from the graph that the MOS transistor threshold voltage exerts a greater impact on the circuit delay with decrease in power supply voltage $V_{DD}$. Thus, a need arises to reduce the MOS transistor threshold voltage.

A structure including a punch-through stopper layer and a buried layer has been conventionally proposed to provide a high punch-through resistance and a low threshold voltage in the MOS transistors. FIG. 39 is a cross-sectional view of an N-channel buried type MOS transistor 200 disclosed by Nagai et al., "Extended Abstracts of the 1992 Solid State Devices and Materials".

Referring to FIG. 39, a punch-through stopper layer 20 having a positive impurity concentration of $1 \times 10^{18}$ cm$^{-3}$ or more is formed on an upper surface of a P-type semiconductor layer (well) 1. A buried layer 3 is formed on an upper surface of the punch-through stopper layer 20 in a channel region. The buried layer 3 is sandwiched between an N-type source region 41 and an N-type drain region 42.

A gate oxide film 4 is formed on the buried layer 3, and a gate electrode 5 is opposed to the buried layer 3, with the gate oxide film 4 therebetween. Sidewalls 8 are located on the both sides of the gate oxide film 4 and gate electrode 5.

The source region 41 and the semiconductor layer 1 receive 0 V (or are grounded), and a voltage of about 2.5 V is applied to the drain region 42. With the gate electrode 5 at a potential of 0 V, the channel region is depleted and has a low electron concentration. Thus, no current flows between the source region 41 and the drain region 42.

With the gate electrode 5 at a potential of 2.5 V, the channel region has an increased electron concentration and there is a current flow between the source region 41 and the drain region 42. In this manner, the NMOS transistor 200 operates as a switching device depending on the potential at the gate electrode 5.

As stated above, the channel length of 0.5 µm or less, with the gate electrode 5 at the potential of 0 V, causes the drain field to extend into the source region 41, resulting in a current flow between the source region 41 and the drain region 42 (punch-through). The punch-through stopper layer 20 is provided to prevent punch-through. The provision of the punch-through stopper layer 20 increases the threshold voltage of surface channel type MOS transistors. To prevent such an increase, the buried layer 3 is formed by counter doping in the channel region to construct a buried channel type MOS transistor, achieving high punch-through resistance and low threshold voltage.

FIG. 40 is a graph showing a profile of impurity concentration versus depth of the NMOS transistor 200 (in section taken along the line T—T of FIG. 39). The reference numerals indicative of respective portions of the curves represent substantial positions of the corresponding regions. The impurity concentrations of the drain regions 42 and punch-through stopper layer 20 exceed $1 \times 10^{18}$ cm$^{-3}$ at the intersection of the impurity profiles for the drain region 42 and punch-through stopper layer 20.

FIG. 41 is a graph showing a profile of field strength in section taken along the line T—T of FIG. 39. It is understood that the field strength adjacent the junction of the drain region 42 and punch-through stopper layer 20 exceeds $1-10^6$ V/cm.

In this fashion, the NMOS transistor 200, including the punch-through stopper layer 20 having a high impurity concentration, has a narrow depletion layer at the PN junction between the drain region 42 and the punch-through stopper layer 20. This increases the resultant electric field, resulting in an increased leak current.

SUMMARY OF THE INVENTION

According to a first aspect of the present invention, a semiconductor device comprises (a) a semiconductor substrate including a first conductivity type impurity, (b) source and drain regions of a second conductivity type selectively formed in an upper surface of the semiconductor substrate, the source and drain regions making a pair to form an LDD construction, and (c) a buried layer formed in the upper portion of the semiconductor substrate between the source and drain regions, wherein the concentration of the impurity decreases in the vicinity of the junction between the drain region and the semiconductor substrate.

According to a second aspect of the present invention, a semiconductor device comprises (a) a semiconductor substrate having an upper surface, and (b) a first MOS transistor including, (b-1) source and drain regions selectively formed in the upper surface of the semiconductor substrate and making a pair to form an LDD construction, (b-2) a first punch-through stopper layer formed in the upper surface of the semiconductor substrate between the source and drain regions, the peak of the impurity concentration of the first punch-through stopper layer being closer to the upper surface of the semiconductor substrate than the bottom of the drain region, (b-3) a buried layer formed in an upper portion of the first punch-through stopper layer, (b-4) a gate oxide film formed on the buried layer, and (b-5) a gate electrode opposed to the buried layer, with the gate oxide film therebetween, wherein the bottom of the drain region is defined at the intersection of the curves of the impurity profiles of the drain region and the first punch-through stopper layer.

Preferably, according to a third aspect of the present invention, the first MOS transistor further includes (b-6) a second punch-through stopper layer disposed under the bottom of the drain region and the first punch-through stopper layer, and being of the same conductivity type as the first punch-through stopper layer and having an impurity concentration lower than that of the first punch-through stopper layer.

Preferably, according to a fourth aspect of the present invention, the semiconductor device further comprises (c) a surface channel type second MOS transistor of the same conductivity type as the first MOS transistor and formed on the semiconductor substrate.

Preferably, according to a fifth aspect of the present invention, the semiconductor device further comprises (c) a second MOS transistor of opposite conductivity type to the first MOS transistor, the second MOS transistor including (c-1) source and drain regions selectively formed in the upper surface of the semiconductor substrate and making a pair to form an LDD construction, (c-2) a punch-through stopper layer formed in the upper surface of the semiconductor substrate between the source and drain regions of the second MOS transistor, the peak of the impurity concentration of the punch-through stopper layer of the second MOS transistor being closer to the upper surface of the semiconductor substrate than the bottom of the drain region of the second MOS transistor, (c-3) a buried layer formed in an upper portion of the punch-through stopper layer of the second MOS transistor, (c-4) a gate oxide film formed on the buried layer of the second MOS transistor, and (c-5) a gate electrode opposed to the buried layer of the second MOS transistor, with the gate oxide film of the second MOS transistor therebetween, wherein the peak of the impurity concentration of the buried layer of the second MOS transistor is at the same depth as a peak of the impurity concentration of the first punch-through stopper layer of the first MOS transistor, and the bottom of the drain region is defined at the intersection of the curves of the impurity profiles of the drain region and the punch-through stopper layer of the second MOS transistor.

According to a sixth aspect of the present invention, a method of fabricating a semiconductor device comprises the steps of (a) providing a semiconductor substrate having an upper surface, (b) introducing a first impurity of a first conductivity type into the upper surface of the semiconductor substrate to form a semiconductor layer, (c) introducing a second impurity of the first conductivity type from an upper surface of the semiconductor layer to form a first punch-through stopper layer having a concentration profile exhibiting a peak at a first depth from the upper surface of the semiconductor substrate, (d) introducing a third impurity of a second conductivity type opposite to the first conductivity type from above the first punch-through stopper layer to form a buried layer adjacent the upper surface of the semiconductor substrate, (e) forming a gate oxide film on the buried layer, (f) forming a gate electrode opposed to the buried layer, with the gate oxide film therebetween, and (g) introducing a fourth impurity of the second conductivity type from above the buried layer into regions sandwiching therebetween a portion of the buried layer which lies immediately under the gate electrode to form a drain region and a source region, the drain region having a bottom at a second depth from the upper surface of the semiconductor substrate, wherein the bottom of the drain region is defined at the intersection of the curves of the impurity profiles of the drain region and the first punch-through stopper layer, and the second depth is greater than the first depth.

Preferably, according to a seventh aspect of the present invention, the method further comprises the step of (h) introducing a fifth impurity of the first conductivity type from the upper surface of the semiconductor layer to form a second punch-through stopper layer having a concentration profile exhibiting a peak at a third depth from the upper surface of the semiconductor substrate, the step (h) being performed between the steps (b) and (c), the third depth being greater than the second depth.

According to an eighth aspect of the present invention, a method of fabricating a semiconductor device comprises the steps of (a) providing a semiconductor substrate having an upper surface containing first and second regions, (b) simultaneously introducing a first impurity of a first conductivity type into the first and second regions of the semiconductor substrate to form a first punch-through stopper layer and a semiconductor layer respectively in the first and second regions, the first punch-through stopper layer and the semiconductor layer having a concentration profile exhibiting a peak at a first depth from the upper surface, (c) introducing a second impurity of a second conductivity type opposite to the first conductivity type from above the first region to form a first buried layer adjacent the first region, (d) introducing a third impurity of the second conductivity type from above the second region to form a second punch-through stopper layer and to reduce an effective thickness of the semiconductor layer to form a second buried layer, (e) forming first and second gate oxide films on the first and second buried layers, respectively, (f) forming a first gate electrode opposed to the first buried layer, with the first gate oxide film therebetween, and a second gate electrode opposed to the second buried layer, with the second gate oxide film therebetween, (g) introducing a fourth impurity of the second conductivity type from above the first buried layer into regions sandwiching therebetween a portion of the first buried layer which lies immediately under the first gate electrode to form a first drain region and a first source region, the first drain region having a bottom at a second depth from the first region, and (h) introducing a fifth impurity of the first conductivity type from above the second buried layer into regions sandwiching therebetween a portion of the second buried layer which lies immediately under the second gate electrode to form a second drain region and a second source region, the second drain region having a bottom at a third depth from the second region, wherein the bottom of the first drain region is defined at the intersection of the curves of the impurity profiles of the first drain region and the first punch-through stopper layer, the bottom of the second drain region is defined at the intersection of the curves of the impurity profiles of the second drain region and the second punch-through stopper layer, and the second and third depths are greater than the first depth.

Preferably, according to a ninth aspect of the present invention, the method further comprises the steps of (i) forming a first well of the first conductivity type under the first region, the first well having a bottom deeper than the first punch-through stopper layer, and (j) forming a second well of the second conductivity type under the second region, the second well having a bottom deeper than the second punch-through stopper layer, the steps (i) and (j) being performed between the steps (b) and (c).

In the semiconductor device according to the first aspect of the present invention, the low impurity concentration of the semiconductor substrate adjacent the bottom of the drain region alleviates the field strength at the junction of the drain region and semiconductor substrate. The high impurity concentration adjacent the upper surface prevents punch-through. The buried layer decreases the threshold voltage.

In the semiconductor device according to the second aspect of the present invention, the low impurity concentration of the portion forming the junction with the drain region alleviates the field strength at the junction. The first punch-through stopper layer prevents punch-through. The buried layer decreases the threshold voltage.

Therefore, the threshold voltage is decreased with suppression of punch-through as well as the increase of the junction leak current is prevented.

In the semiconductor device according to the third aspect of the present invention, the second punch-through stopper layer also prevents punch-through.

Therefore, punch-through is suppressed more effectively.

In the semiconductor device according to the fourth aspect of the present invention, the second MOS transistor of surface channel type can provide a threshold voltage higher than the first MOS transistor.

Therefore, two MOS transistors having threshold voltage different from each other are provided on the same semiconductor substrate.

In the semiconductor device according to the fifth aspect of the present invention, the buried layer of the second MOS transistor and the first punch-through stopper layer of the first MOS transistor may be formed simultaneously.

Therefore, two MOS transistors are fabricated in simplified process, both of which give the effect of the semiconductor device according to the second aspect of the present invention, and the conductivity types of which are different from each other.

In the method according to the sixth aspect of the present invention, the second depth of the bottom of the drain region is estimated at the intersection of the third impurity concentration profile and the first and second impurity concentration profiles. Since the first depth of the peak of the second impurity concentration is less than the second depth, the impurity concentration at the second depth is decreased.

Therefore, fabricated is the semiconductor device of which threshold voltage is decreased with suppression of punch-through preventing the increase of the junction leak current.

In the method according to the seventh aspect of the present invention, the second punch-through stopper layer also prevents punch-through. Therefore, fabricated is the semiconductor device which suppresses punch-through more effectively.

In the method according to the eighth and ninth aspects of the present invention, the first punch-through stopper layer and the semiconductor layer to be formed into the second buried layer are formed simultaneously.

Therefore, two MOS transistors according to the fifth aspect of the present invention are fabricated in simple process.

It is therefore an object of the present invention to provide a semiconductor device having high punch-through resistance and low threshold voltage, with leak current reduced by decreasing an electric field applied across the junction of a drain region and other semiconductor layers, and a method of fabricating the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
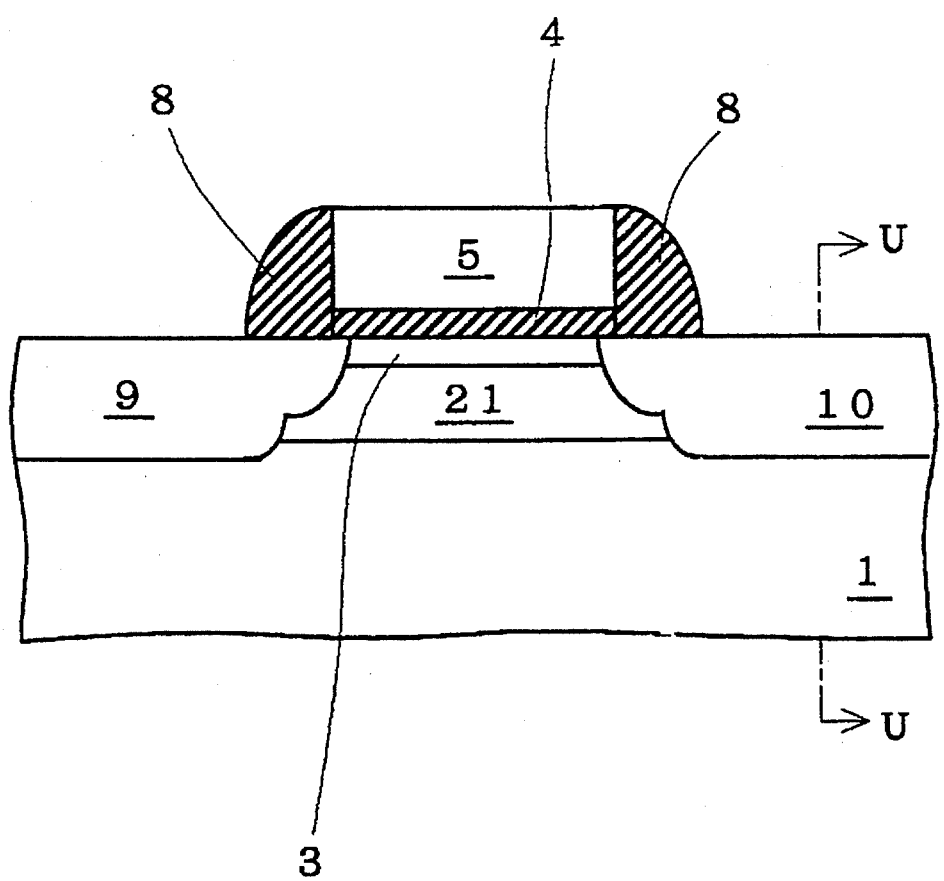
FIG. 1 is a cross-sectional view of a first preferred embodiment according to the present invention.

First Preferred Embodiment:

FIG. 1 is a cross-sectional view of an NMOS transistor 101 according to a first preferred embodiment of the present invention. A punch-through stopper layer 21 having a positive impurity concentration is formed on an upper surface of a P-type semiconductor layer (well) 1. A buried layer 3 is formed on an upper surface of the punch-through stopper layer 21 in a channel region. The buried layer 3 is sandwiched between an N-type source region 9 and an N-type drain region 10.

A gate oxide film 4 is formed on the buried layer 3, and a gate electrode 5 is opposed to the buried layer 3, with the gate oxide film 4 therebetween. Sidewalls 8 are located on the side of the gate oxide film 4 and gate electrode 5.

Figure 2:
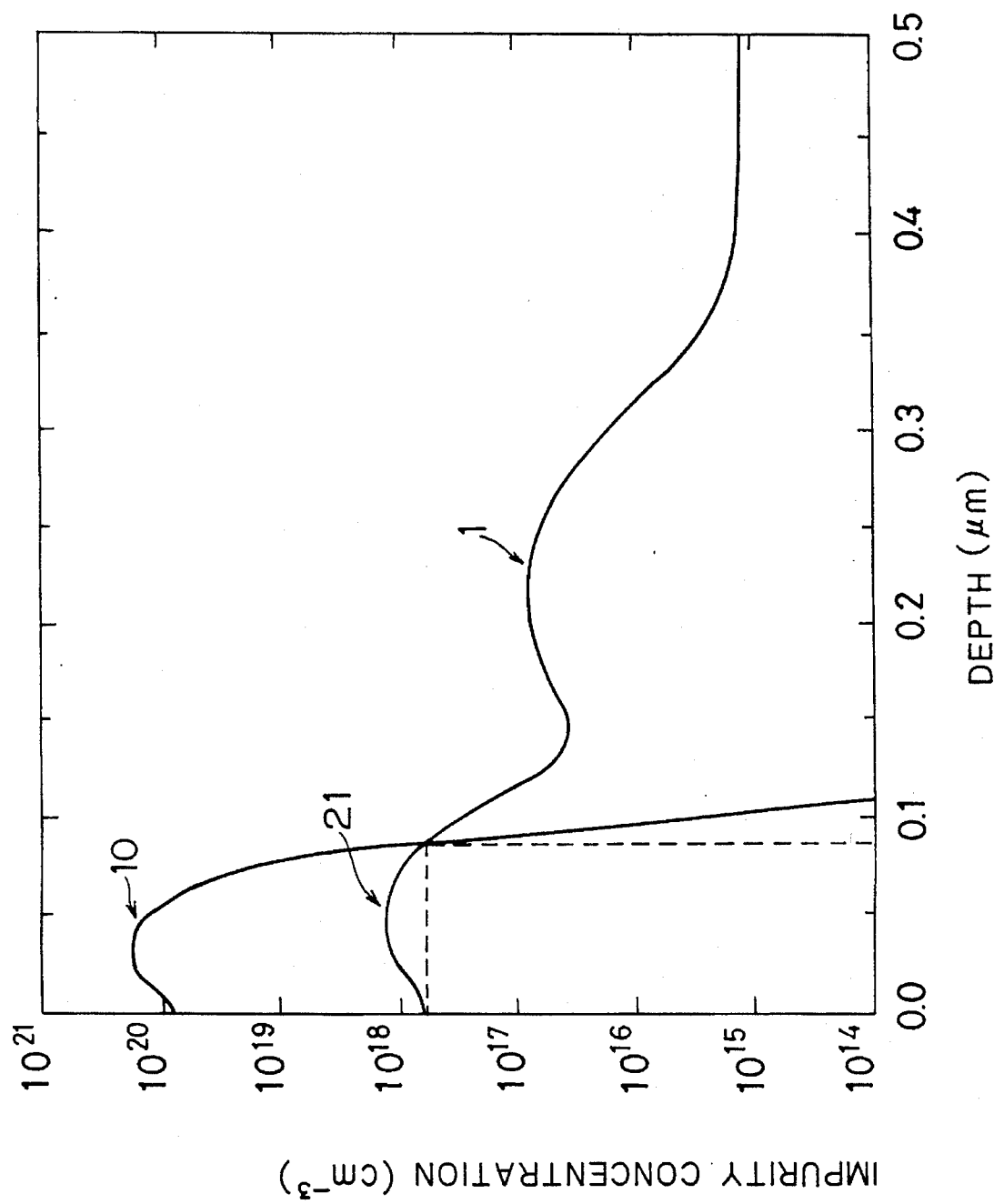
FIG. 2 is a graph showing an impurity concentration of the first preferred embodiment according to the present invention.

FIG. 2 is a graph showing a profile of impurity concentration versus depth of the NMOS transistor 101 (in section taken along the line U—U of FIG. 1). The reference numerals indicative of respective portions of the curves represent substantial positions of the corresponding regions. The impurity concentrations of the drain region 10 and punch-through stopper layer 21 are less than $1\times10^{18}$ cm$^{-3}$ at the intersection of the impurity profiles for the drain region 10 and punch-through stopper layer 21.

In the NMOS transistor 200 of the background art, the impurity peak for the punch-through stopper layer 20 is deeper than the drain region 42. In the NMOS transistor 101 according to the present invention, on the other hand, the impurity peak for the punch-through stopper layer 21 is shallower than the drain region 10. The bottom of the drain region 10 is estimated at the intersection of the curves of the impurity profiles of the drain region 10 and punch-through stopper layers 20, 21.

In this manner, the impurity concentration of the layer underlying the drain region 10 in the NMOS transistor 101, which is lower than that in the NMOS transistor 200, allows the field strength generated at the junction of the drain region 10 and the underlying layer to be alleviated.

Figure 3:
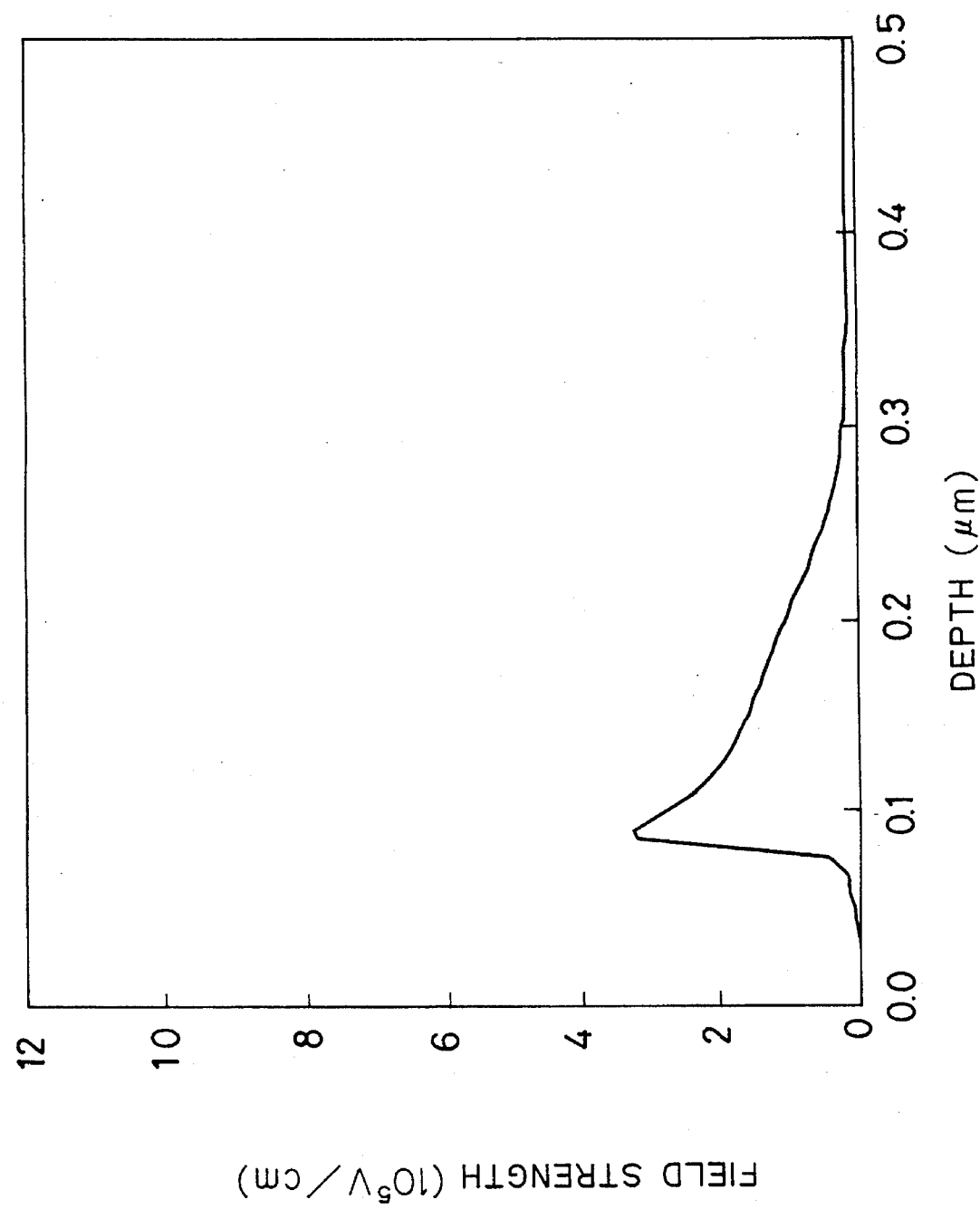
FIG. 3 is a graph showing a field strength of the first preferred embodiment according to the present invention.
Figure 41:
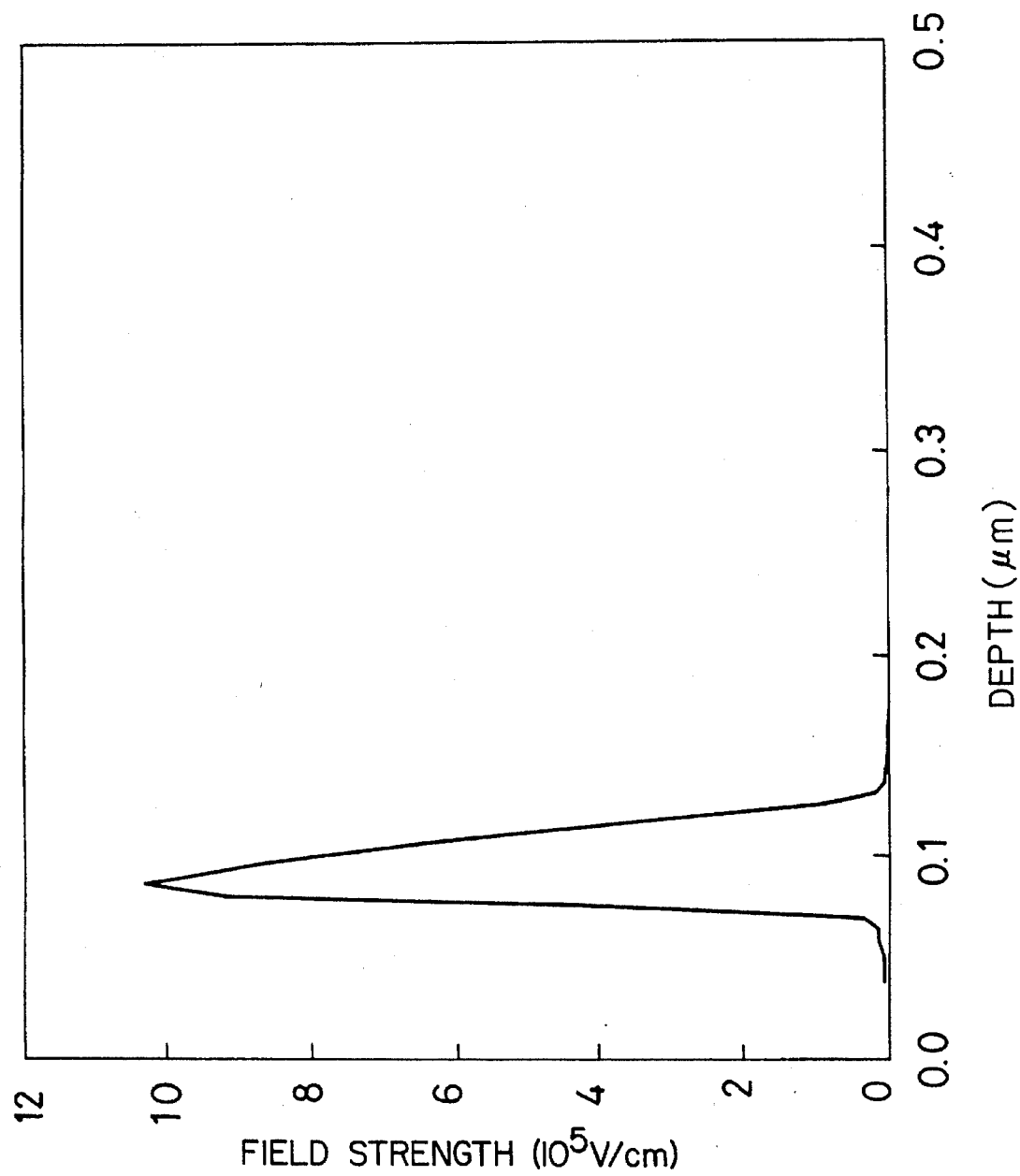
FIG. 41 is a graph showing a field strength of the background art.

FIG. 3 is a graph showing a simulated field strength result in section taken along the line U—U of FIG. 1 and corresponding to FIG. 41. It is found from FIG. that the field strength adjacent the junction between the drain region 10 and punch-through stopper layer 20 is reduced to about $2\times10^5$ V/cm.

Further, the drain region 10, unlike the drain region 42, may be of an LDD construction to alleviate the electric field between the punch-through stopper layer 21 and drain region 10 in the NMOS transistor 101.

Figure 4:
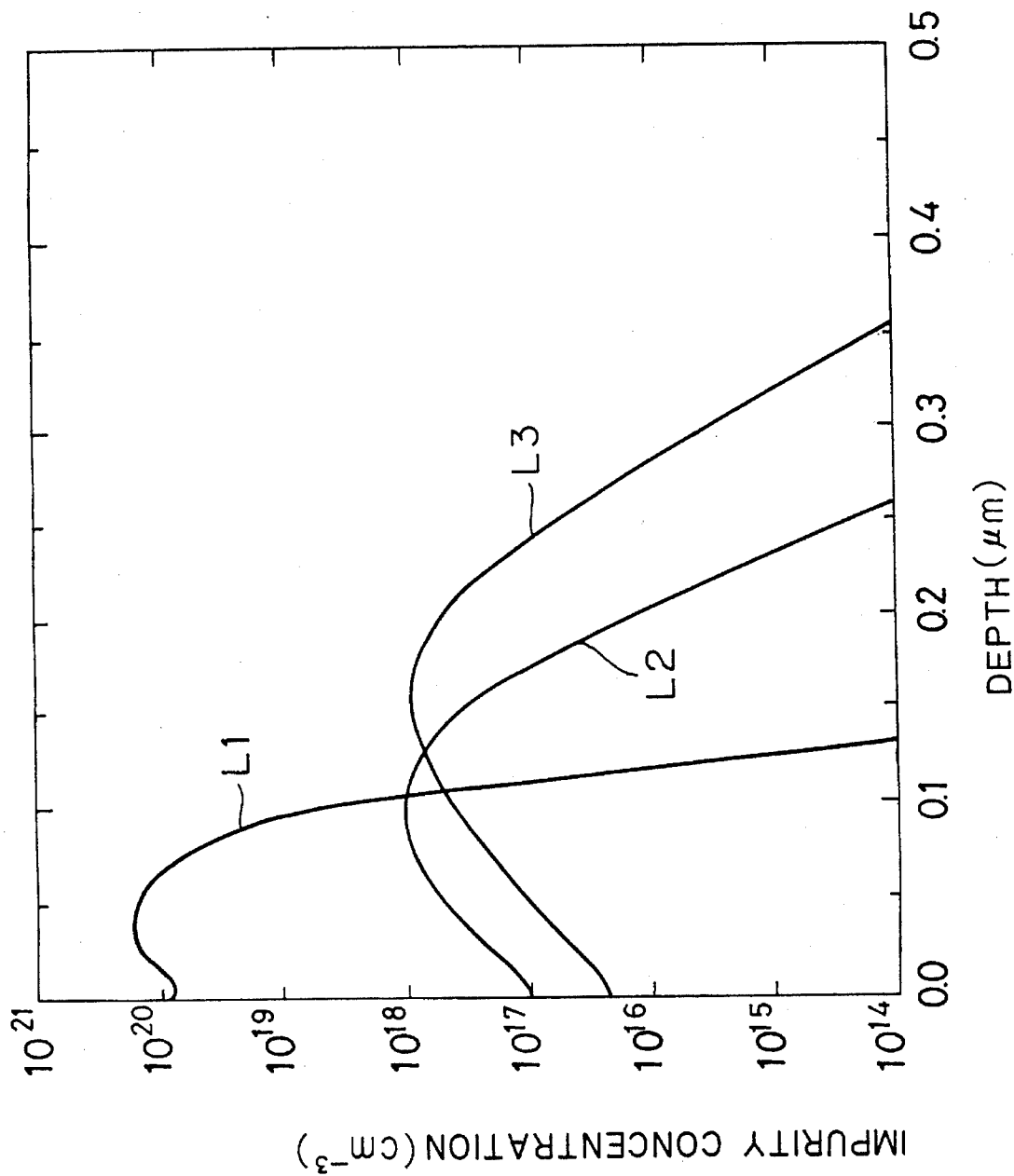
FIGS. 4 to 8 are graphs illustrating the first preferred embodiment according to the present invention.

The first preferred embodiment will be examined from another aspect. It is assumed that the NMOS transistor 101 includes no buried layer 3. FIG. 4 is a graph showing a profile of impurity concentration. The curve L1 of FIG. 4 indicates the concentration of impurities (for example, arsenic) for the drain region 10. The curves L2 and L3 of FIG. 4 indicate the impurity concentrations of two different types of the punch-through stopper layer 20 where impurities (for example, boron) are implanted at 30 keV for the curve L2 and at 50 keV for the curve L3. Such control on implantation energy allows control on the peak position of the impurity concentration of the punch-through stopper layer and, accordingly, control on the impurity concentration of the layer underlying the drain region 10.

Figure 5:
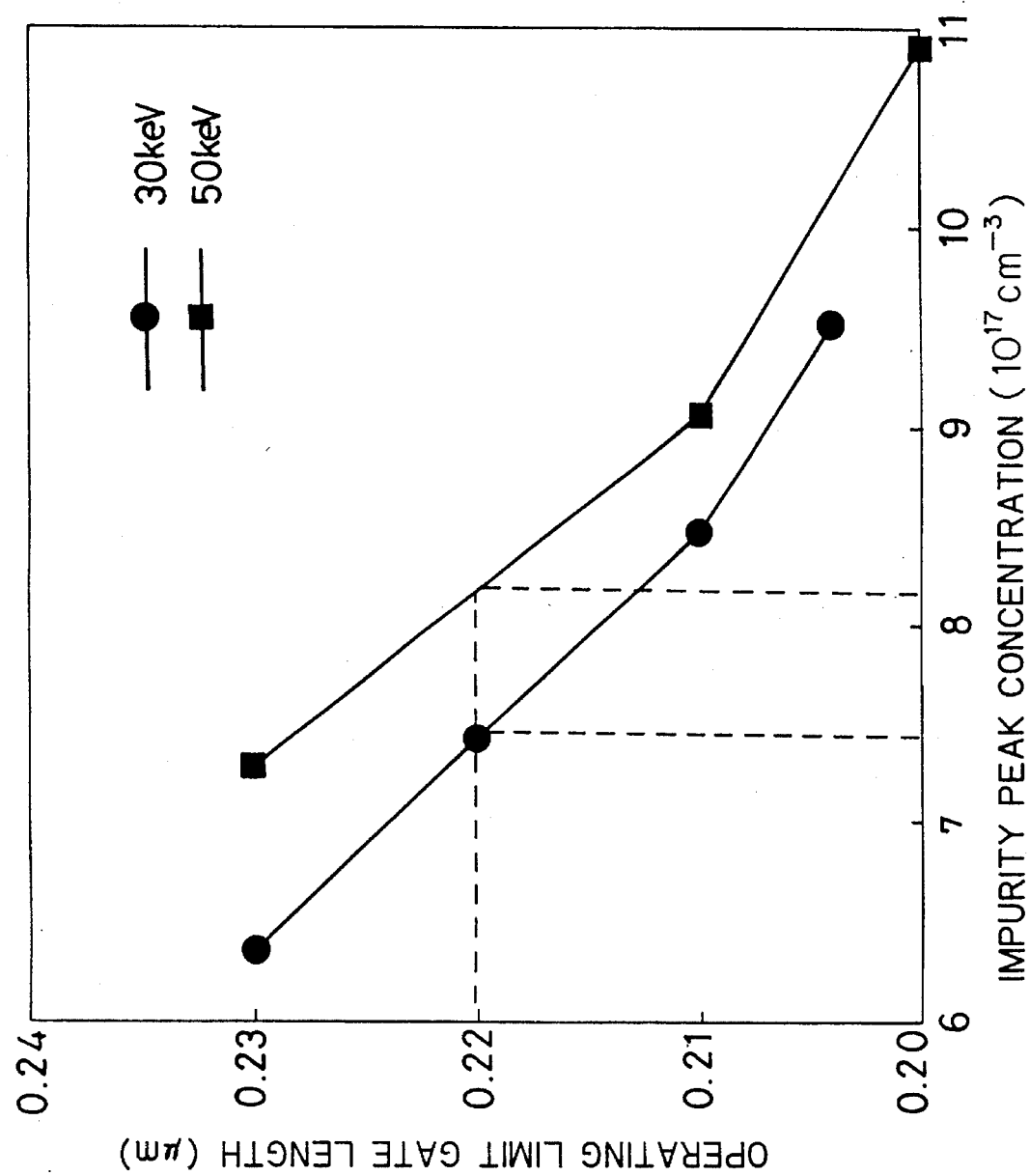

FIG. 5 is a graph plotting an operating limit gate length versus impurity peak concentration for 30 keV and 50 keV boron ion implantations. The operating limit gate length is a minimum gate length which prevents punch-through. For example, it is assumed that a desired operating limit gate length is 0.22 μm. When the peak of impurity concentration of boron is set at a shallow position by ion implantation at 30 keV energy, the required impurity peak concentration is about $7.4\times10^{17}$ cm$^{-3}$. On the other hand, when the peak of impurity concentration of boron is set at a deep position by ion implantation at 50 keV energy, the required impurity peak concentration is about $8.2\times10^{17}$ cm$^{-3}$. The deeper the peak position of the impurity concentration, the higher the required peak concentration.

Figure 6:
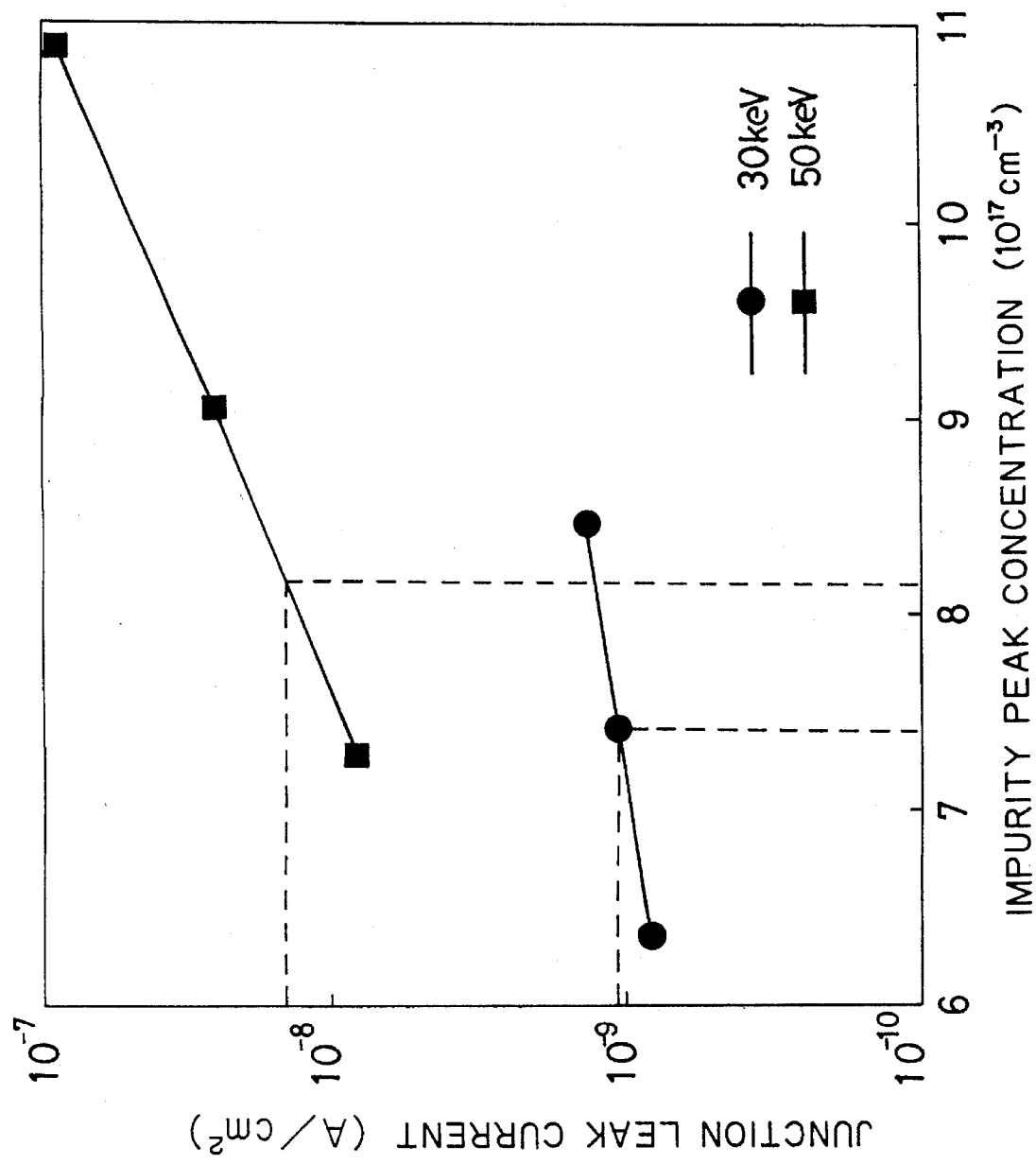

FIG. 6 is a graph plotting a junction leak current versus impurity peak concentration for 30 keV and 50 keV boron ion implantations. The junction leak current for ion implantation at 50 keV is an order of magnitude greater than that for ion implantation at 30 keV and is not preferable.

Figure 7:
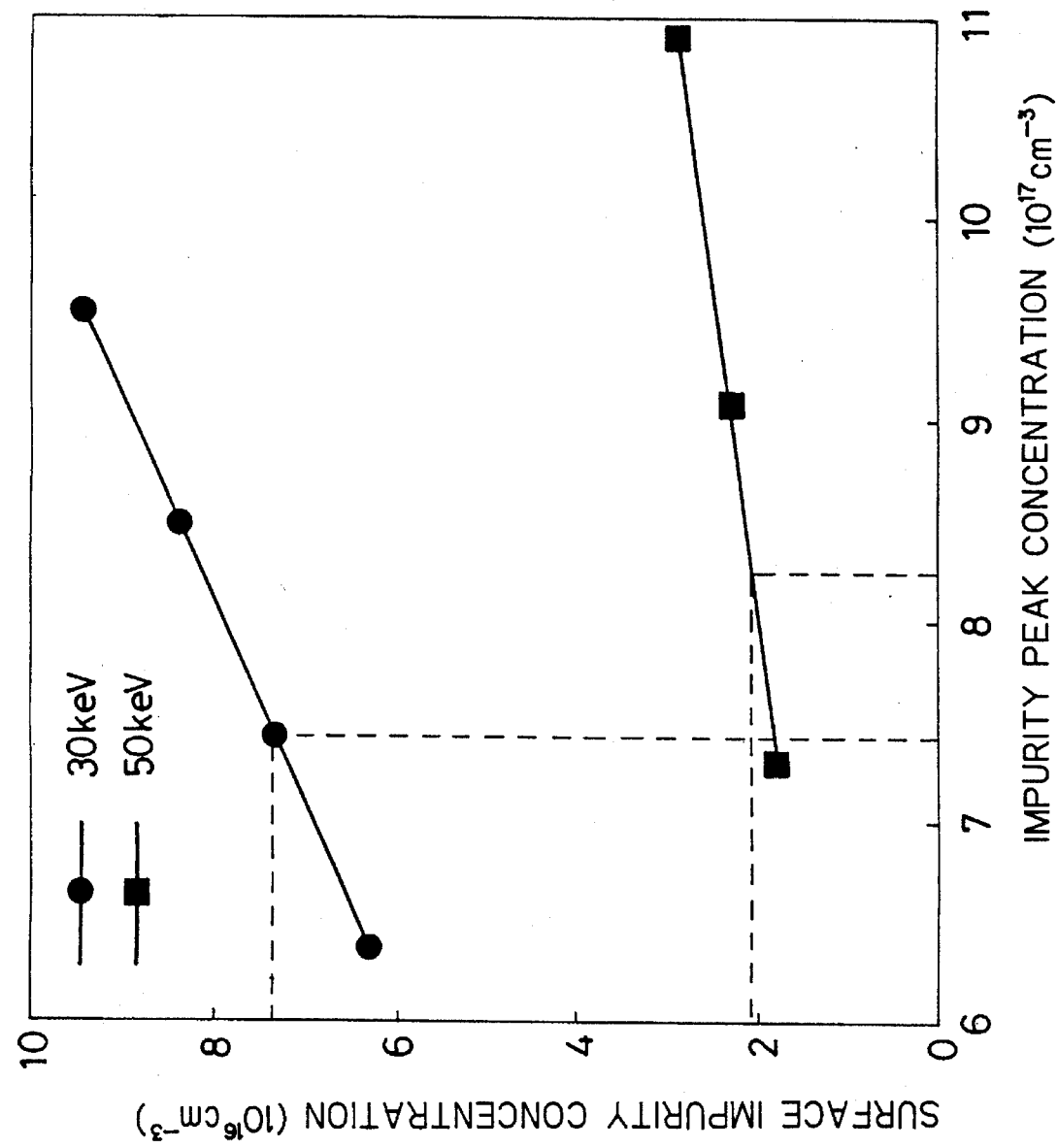

FIG. 7 is a graph plotting a surface impurity concentration versus impurity peak concentration for 30 keV and 50 keV boron ion implantations. The surface impurity concentration for ion implantation at 30 keV is higher than that for ion implantation at 50 keV.

Figure 8:
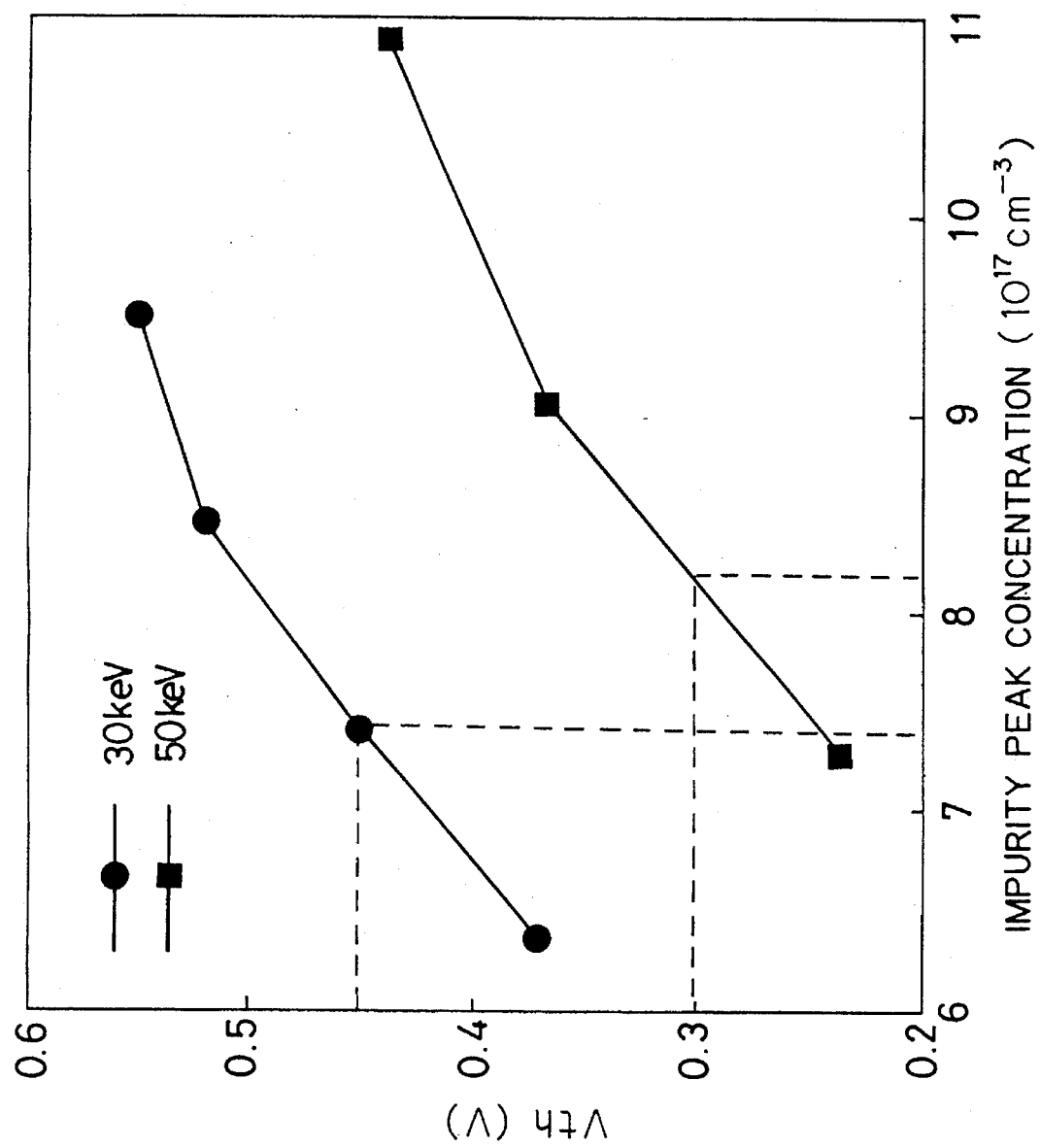

FIG. 8 is a graph plotting a threshold voltage versus impurity peak concentration. It will be understood from FIG. 8 that the lower the energy of ion implantation, the higher the threshold voltage of a transistor to be formed.

The NMOS transistor 101 is hence designed so that the punch-through stopper layer 21 is formed in a shallow position to reduce the junction leak current and the buried layer 3 is formed to provide a buried channel, reducing the threshold voltage.

Figure 9:
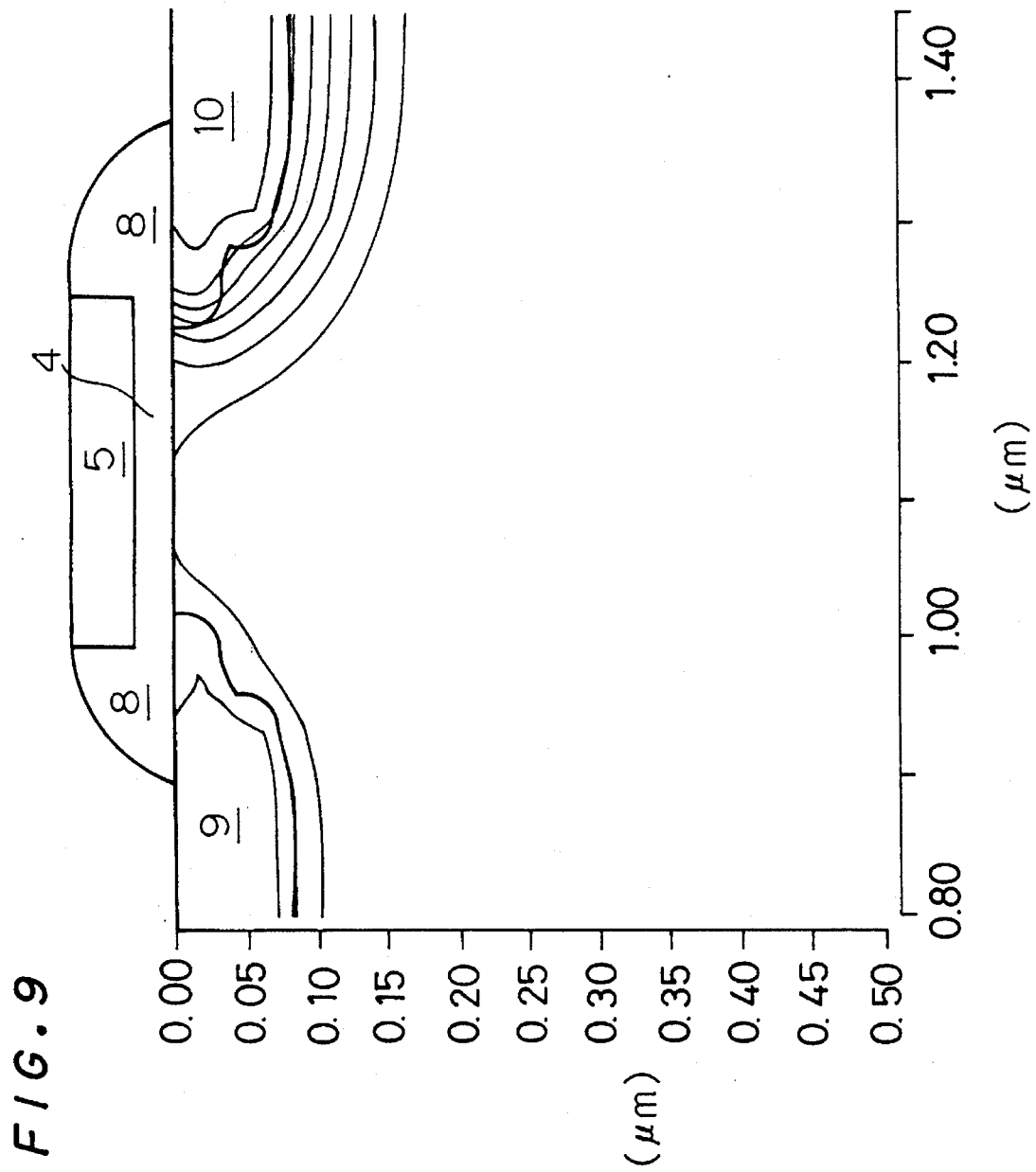
FIG. 9 is a graph illustrating an effect to be compared with the first preferred embodiment according to the present invention.
Figure 10:
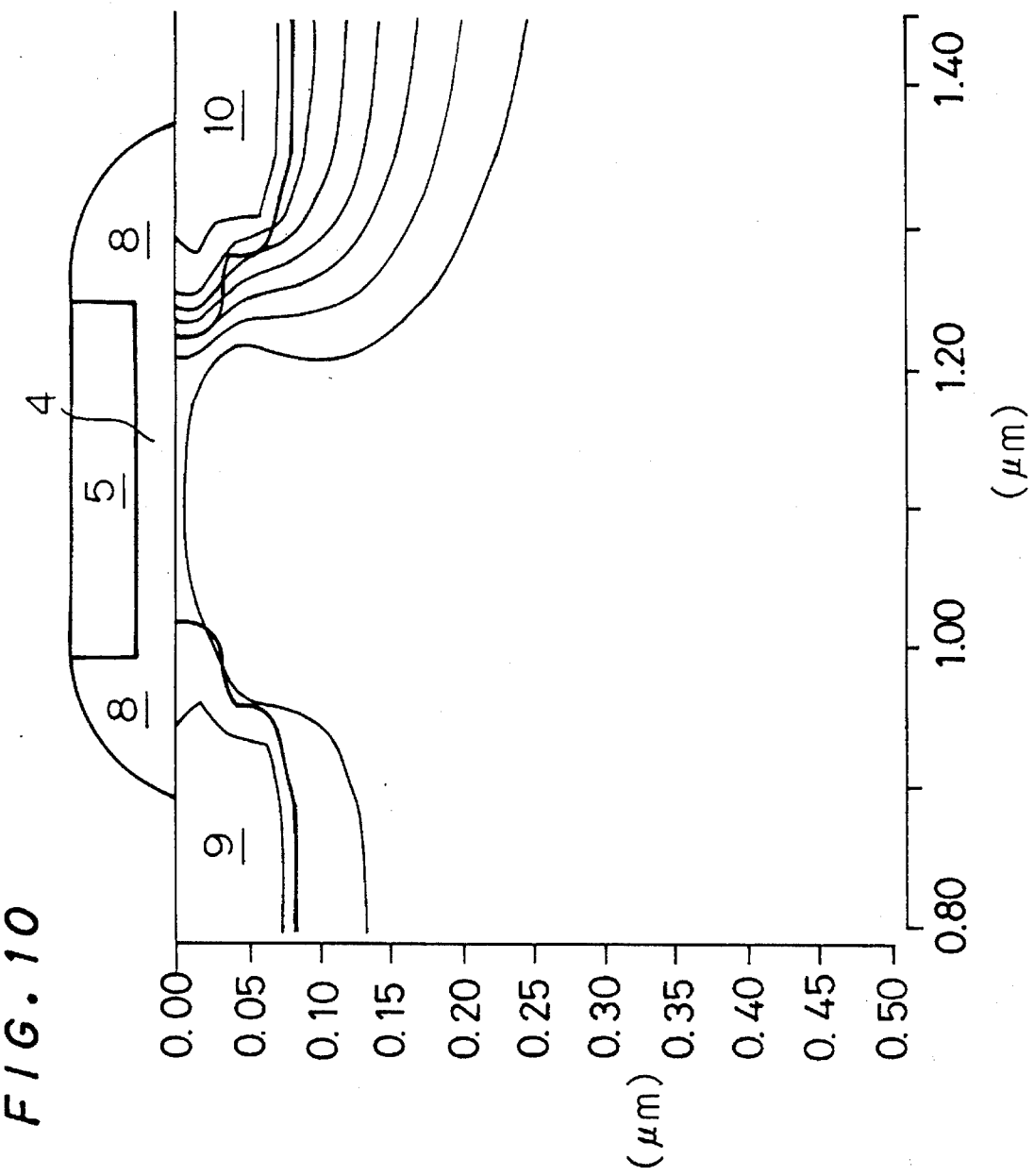
FIG. 10 is a graph illustrating an effect of the first preferred embodiment according to the present invention.

FIGS. 9 and 10 are graphs showing simulated potential distribution results. In FIG. 9, the impurity concentration is set to provide a threshold voltage of 0.3 V in the absence of the buried layer 3. In FIG. 10, the impurity concentration is set to provide a threshold voltage of 0.3 V in the presence of the buried layer 3.

A potential of 2.5 V is applied to the drain region 10, with the potentials at the gate electrode 5, source region 9 and semiconductor layer 1 held at 0 V. Adjacent distribution lines have a potential difference of 0.5 V. As a result of comparison between FIGS. 9 and 10, it is found that the distribution lines indicative of potentials in FIG. 9 are spaced more closely than that in FIG. 10 under the drain region 10. That is, the field strength in FIG. 9 is greater than that in FIG. 10. Leftward extension of the potential distribution from the drain region 10 adjacent the surface in FIG. 10 is smaller than that in FIG. 9 and it is accordingly found that the arrangement of FIG. 10 is more resistant to punch-through.

Consequently, the first preferred embodiment in which the punch-through stopper layer 21 is formed in a shallow position together with the buried layer 3 is found to provide improved punch-through and junction leak current characteristics over the background art arrangement under the same threshold voltage conditions.

Figure 40:
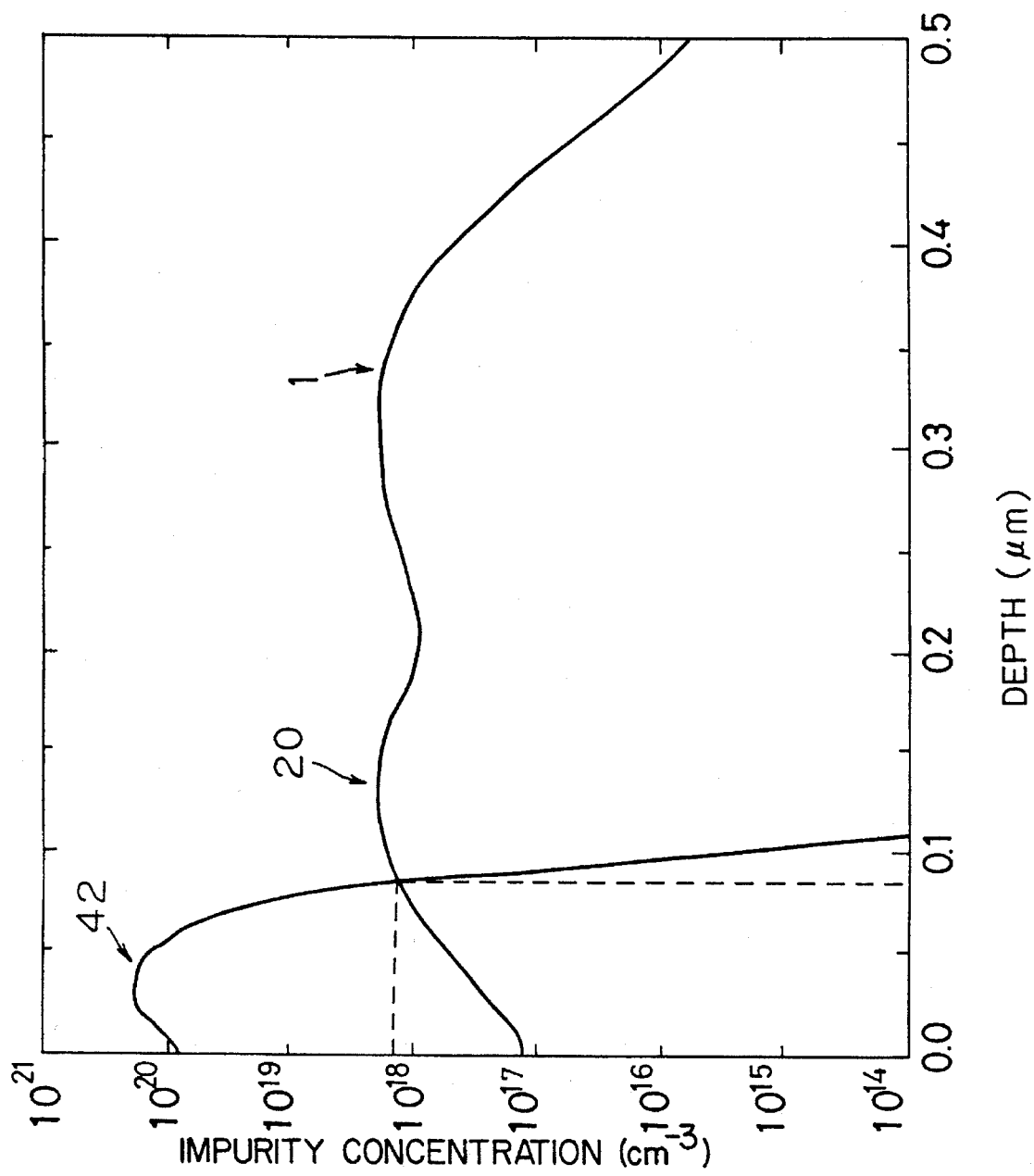
FIG. 40 is a graph showing an impurity concentration of the background art.

The effects of the first preferred embodiment may be discussed from still another aspect. In FIG. 40 showing the background art impurity concentration profile, the impurity concentration is held substantially constant to about $1\times10^{18}$ cm$^{-3}$ between the peak of impurity concentration for the punch-through stopper layer 20 and the peak of impurity concentration for the semiconductor layer 1.

In FIG. 2 showing the impurity concentration profile of the first preferred embodiment, there is a valley of impurity concentration between the peak of impurity concentration for the punch-through stopper layer 21 and the peak of impurity concentration for the semiconductor layer 1, and the valley provides a reduced impurity concentration of about $5\times10^{16}$ cm$^{-3}$.

Therefore, a low impurity concentration is provided at the junction between the drain region 10 and the underlying layer as above stated. Further, the impurity concentration valley assists the depletion layer in extending from the junction toward the semiconductor layer 1 to further inhibit the increase in field strength, achieving preferable junction leak current characteristic.

A description will be given on a fabrication process for accomplishing the arrangement of the first preferred embodiment according to the present invention. FIG. 11 and FIGS. 13 to 15 are cross-sectional views showing the fabrication process of the NMOS transistor 101 in step-by-step fashion.

First, a device isolation oxide film 92 is formed on a surface of a silicon substrate 100 to surround a predetermined region. Boron ions are implanted in the direction of the arrows of FIG. 11 at 200 keV and $2 \times 10^{13}$ cm$^{-2}$ to form the P-type semiconductor layer (well) 1. Further, boron ions are implanted at 80 keV and $5 \times 10^{12}$ cm$^{-2}$ to form a heavily doped layer 91 for device isolation under the device isolation oxide film 92.

The punch-through stopper layer 21 is formed by ion implantation with boron at 15 keV and $8 \times 10^{12}$ cm$^{-2}$. For lower threshold voltage, the buried layer 3 is formed by ion implantation with arsenic at 20 keV and $6 \times 10^{12}$ cm$^{-2}$.

Figure 11:
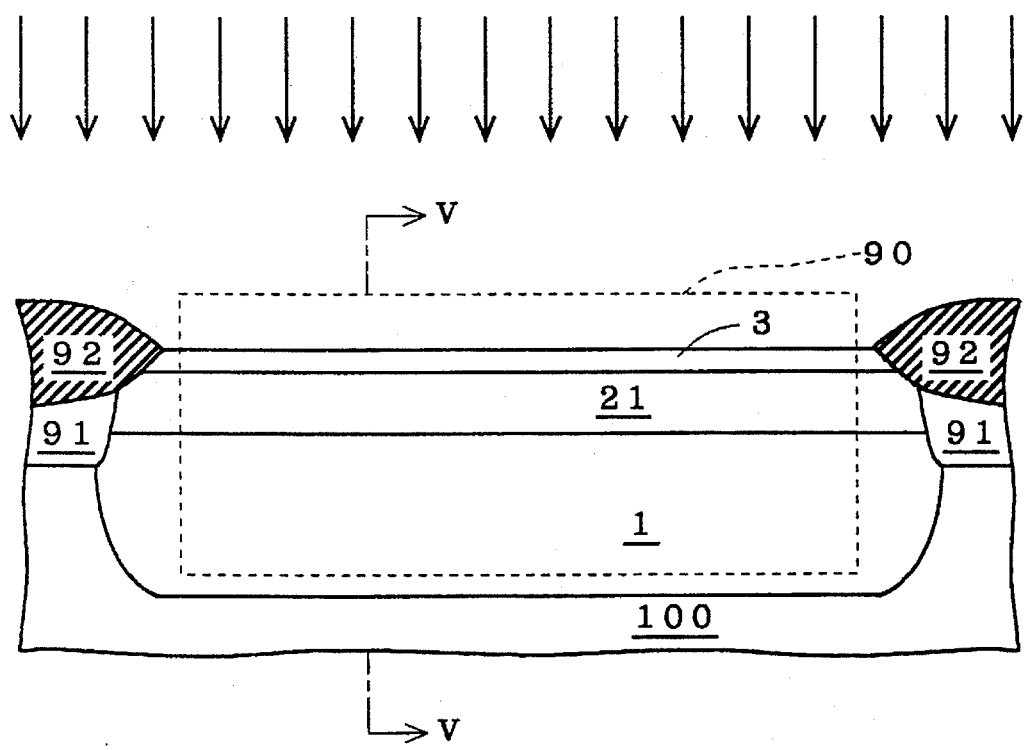
FIG. 11 and FIGS. 13 to 15 are cross-sectional views showing a fabrication process of the first preferred embodiment in step-by-step fashion according to the present invention.
Figure 12:
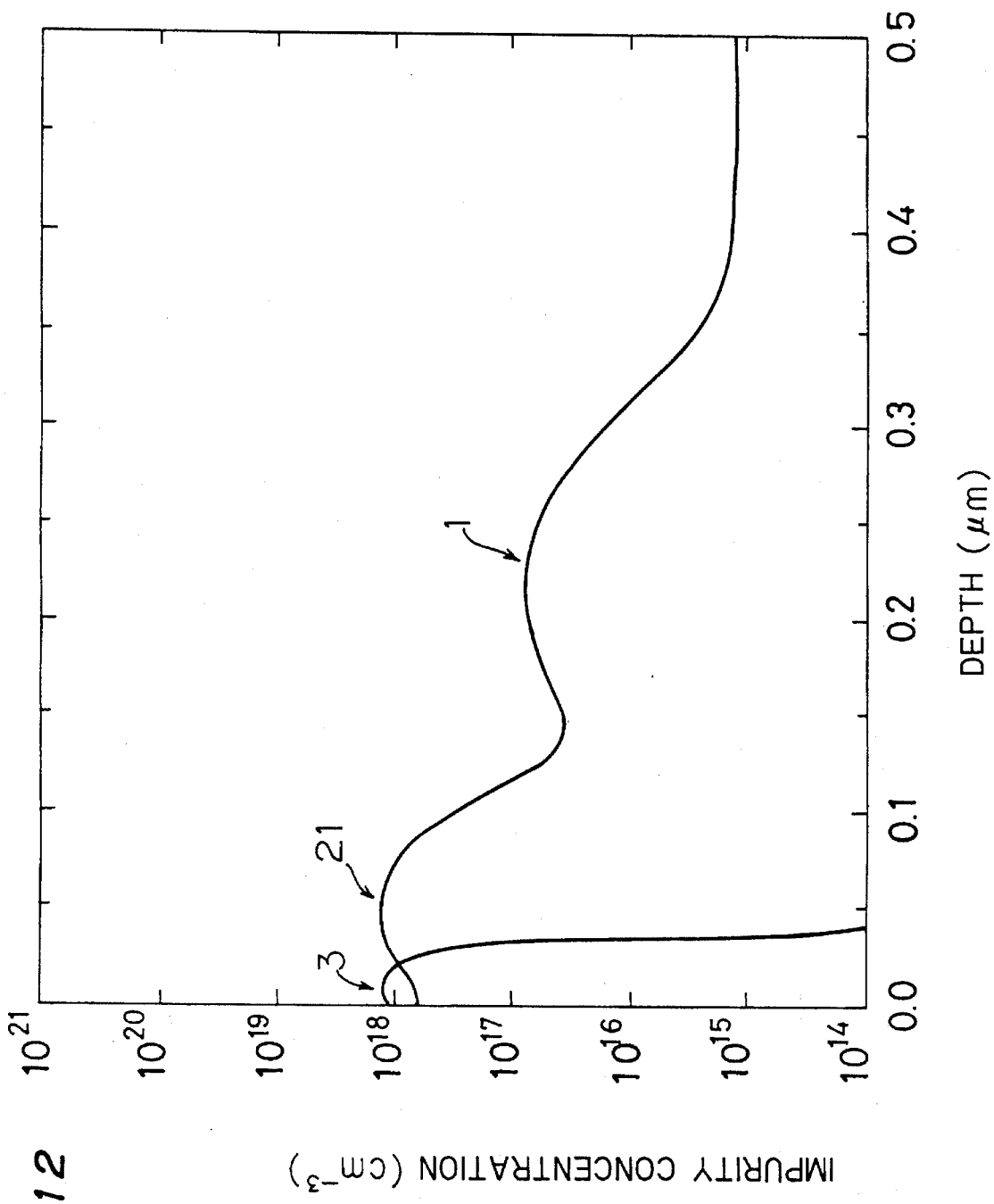
FIG. 12 is a graph showing an impurity concentration of the first preferred embodiment according to the present invention.

FIG. 12 is a graph showing a profile of impurity concentration in section taken along the line V—V of FIG. 11. The boron doped to form the punch-through stopper layer 21 has a concentration peak at a depth of about 0.05 μm from the surface.

Figure 13:
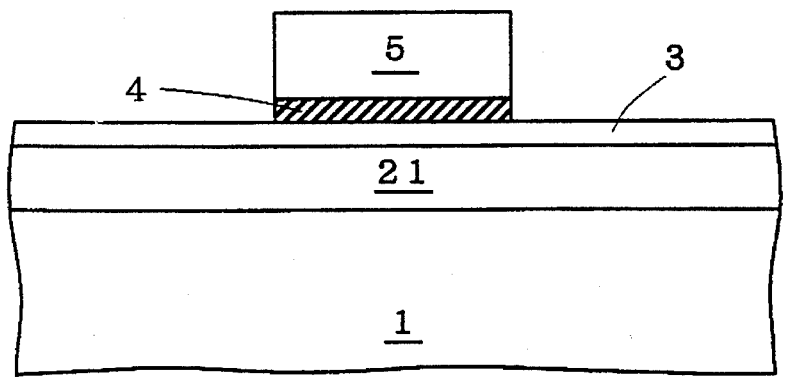
Figure 14:
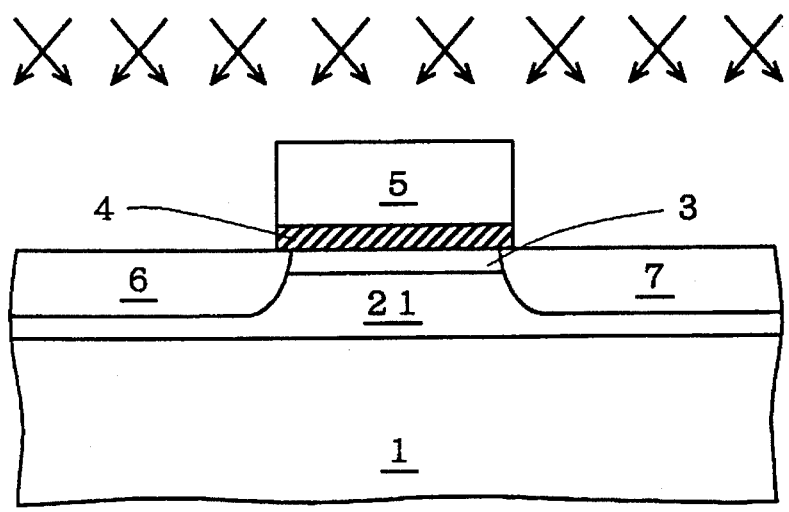
Figure 15:
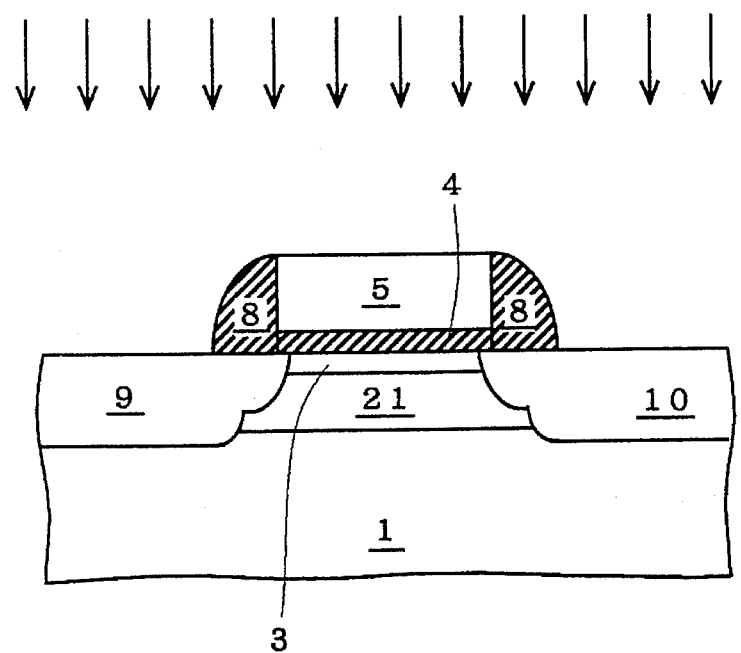

In FIGS. 13 to 15, only a portion 90 formed on the well 1 and its adjacent portions are shown for purposes of simplification. The gate oxide film 4 and the gate electrode 5 are formed in order on the buried layer 3 (FIG. 13). The gate electrode 5 is made of, for example, N$^+$ polysilicon.

To form N$^-$ layers 6 and 7 serving as a basis of the LDD construction, arsenic ions are implanted at an angle of 30 degrees at 30 keV and $5 \times 10^{12}$ cm$^{-2}$ using the gate electrode 5 as a mask (FIG. 14). The N$^-$ layers 6 and 7 have an impurity concentration of about $1 \times 10^{17}$ to $5 \times 10^{18}$ cm$^{-3}$.

An oxide film of about 0.1 μm thickness is deposited by the CVD process and then anisotropically etched to form the sidewalls 8. Arsenic ions are implanted at 60 keV and $2 \times 10^{15}$ cm$^{-2}$ using the gate electrode 5 and sidewalls 8 as a mask to form the source region 9 and drain region 10 having the LDD construction (FIG. 15).

Figure 16:
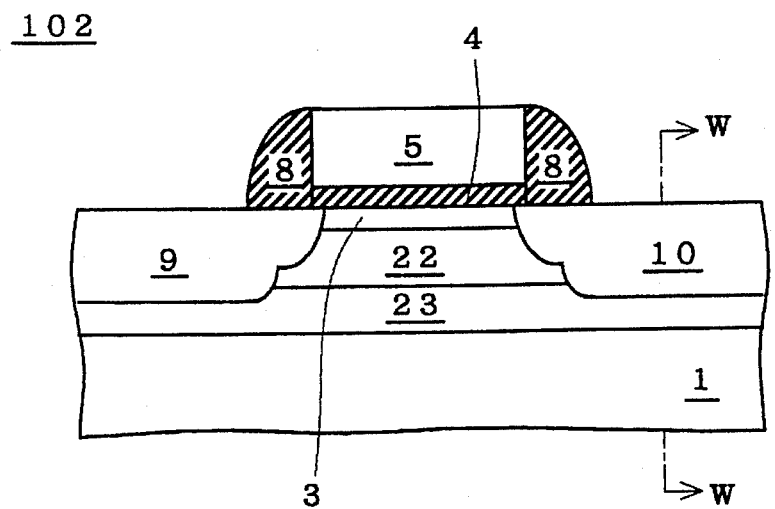
FIG. 16 is a cross-sectional view of a second preferred embodiment according to the present invention.
Figure 17:
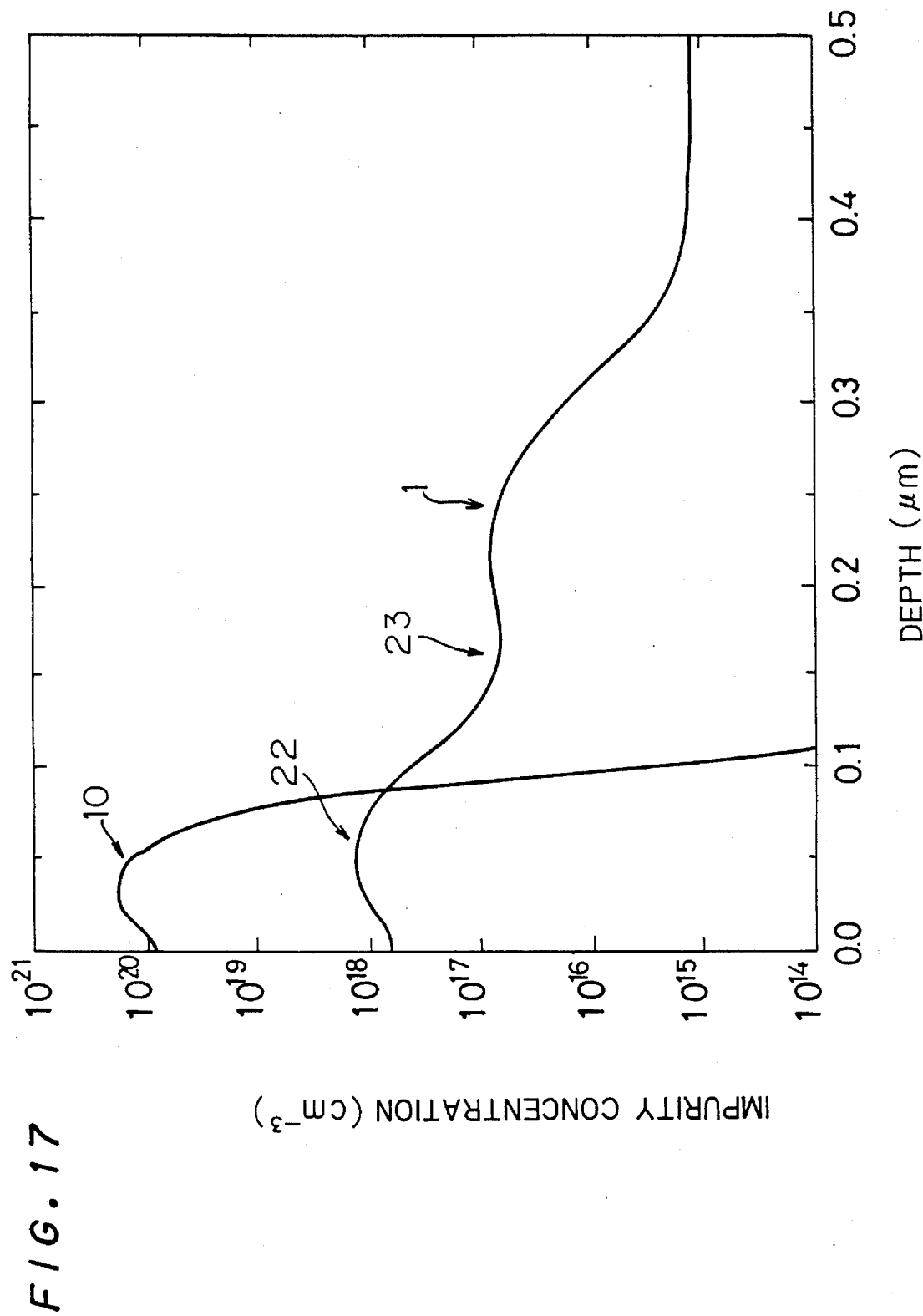
FIG. 17 is a graph showing an impurity concentration of the second preferred embodiment according to the present invention.

Second Preferred Embodiment:

FIG. 16 is a cross-sectional view of an NMOS transistor 102 according to a second preferred embodiment of the present invention. FIG. 17 is a graph showing a profile of impurity concentration versus depth of the NMOS transistor 102 (in section taken along the line W—W of FIG. 16).

The NMOS transistor 102 includes two punch-through stopper layers 22 and 23. The punch-through stopper layer 22, similar to the punch-through stopper layer 21 of the NMOS transistor 101, has its impurity concentration peak in the impurity concentration distribution of the drain region 10. On the other hand, the punch-through stopper layer 23 is deeper than the punch-through stopper layer 22 and has an impurity concentration lower than the impurity concentration at the junction between the punch-through stopper layer 22 and the drain region 10 (at a position where the impurity concentrations of the punch-through stopper layer 22 and drain region 10 are equal in FIG. 17).

The provision of the punch-through stopper layer 23 in a deep position of the source region 9 and drain region 10 in this manner further increases the punch-through resistance of the NMOS transistor 102.

Figure 18:
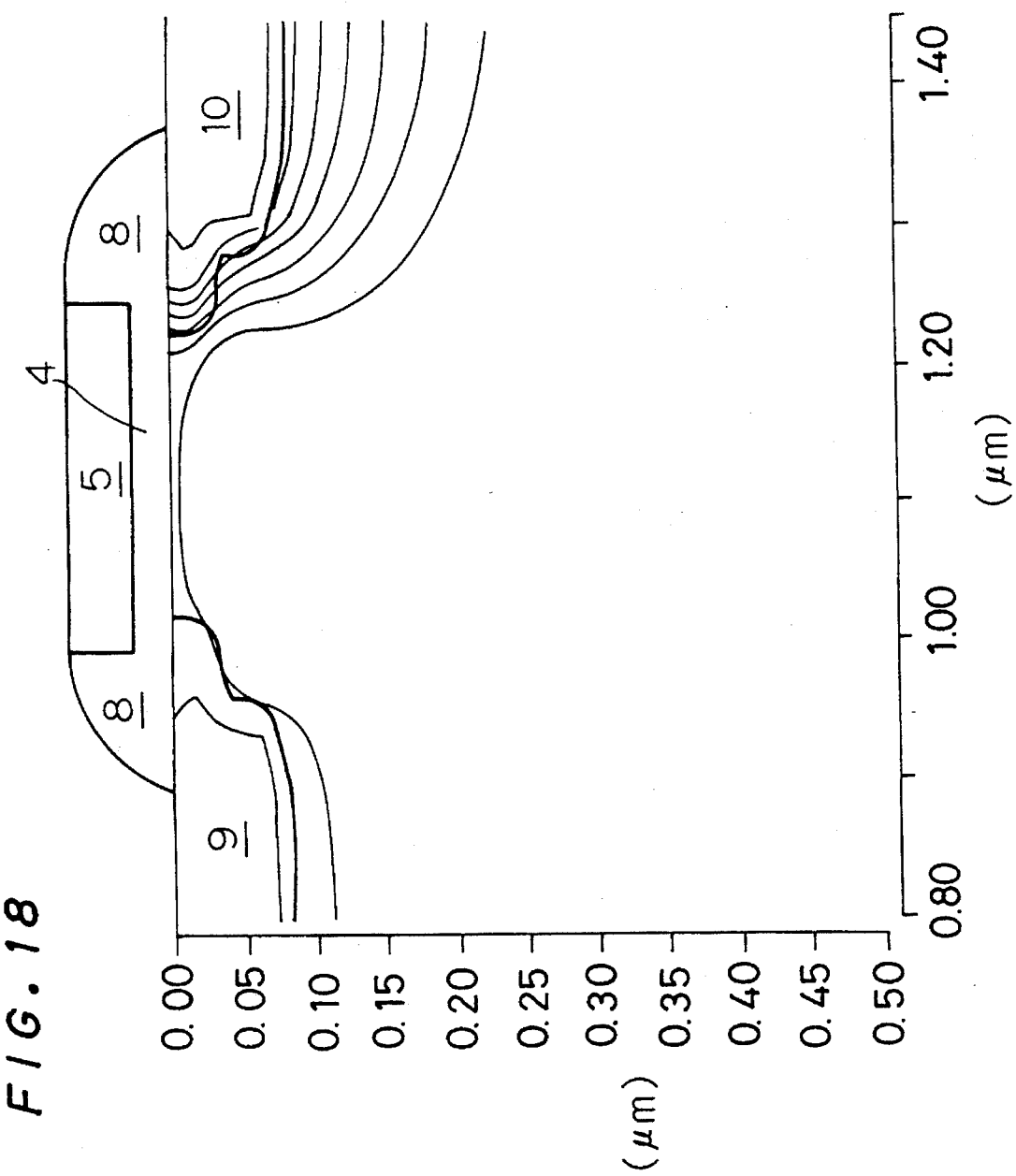
FIGS. 18 and 19 are graphs illustrating effects of the second preferred embodiment according to the present invention.
Figure 19:
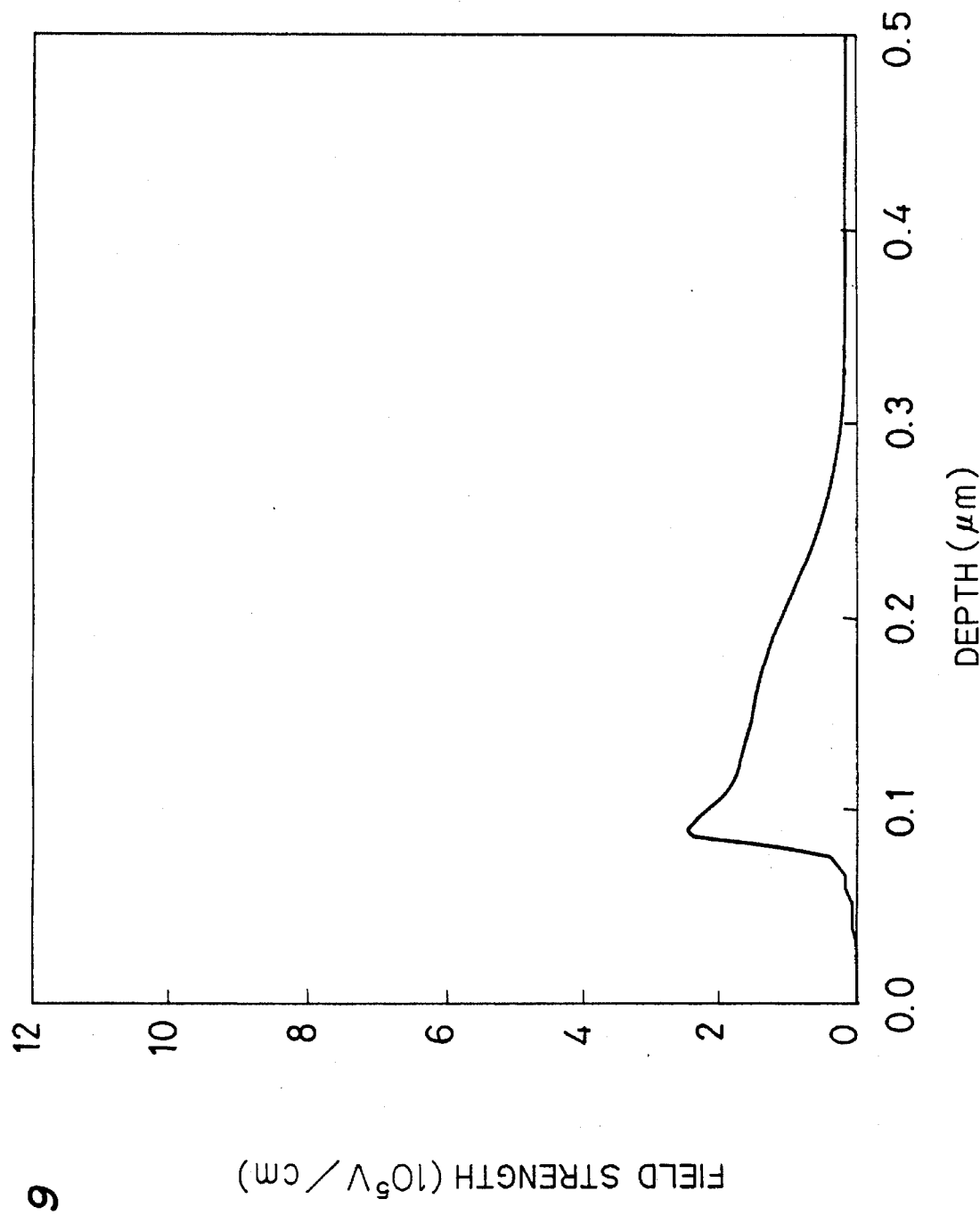

FIG. 18 is a graph showing a simulated potential distribution result. FIG. 19 is a graph showing a simulated field strength result in section taken along the line W—W of FIG. 16. In FIGS. 18 and 19, doped regions having the same arrangements as those of FIGS. 9 and 10 are provided, and the respective impurity concentrations are set to provide a threshold voltage of 0.3 V, with a potential similar to that of FIGS. 9 and 10 applied to the source region 9, drain region 10 and gate electrode 5.

Leftward extension of the potential distribution from the drain region 10 is smaller at a depth of about 0.1 μm, and it is found that the second preferred embodiment is more resistant to punch-through than the first preferred embodiment. The junction field is less than $4 \times 10^5$ V/cm.

Figure 20:
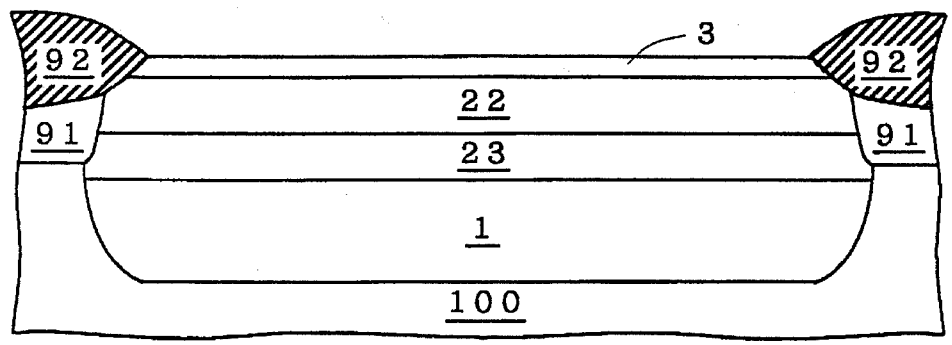
FIG. 20 is a cross-sectional view showing a fabrication process of the second preferred embodiment according to the present invention.

FIG. 20 is a cross-sectional view illustrating a method of fabricating the NMOS transistor 102. The process steps of forming the well 1 and performing ion implantation for device isolation of the first preferred embodiment are carried out. Then boron ions are implanted at 40 keV and $1 \times 10^{12}$ cm$^{-2}$ to form the punch-through stopper layer 23 so that it reaches a level deeper than the source region 9 and drain region 10.

Subsequent process steps similar to those of the first preferred embodiment are executed to form the punch-through stopper layer 22, the buried layer 3, the gate oxide film 4, the gate electrode 5, the sidewalls 8, the source region 9, and the drain region 10.

Figure 21:
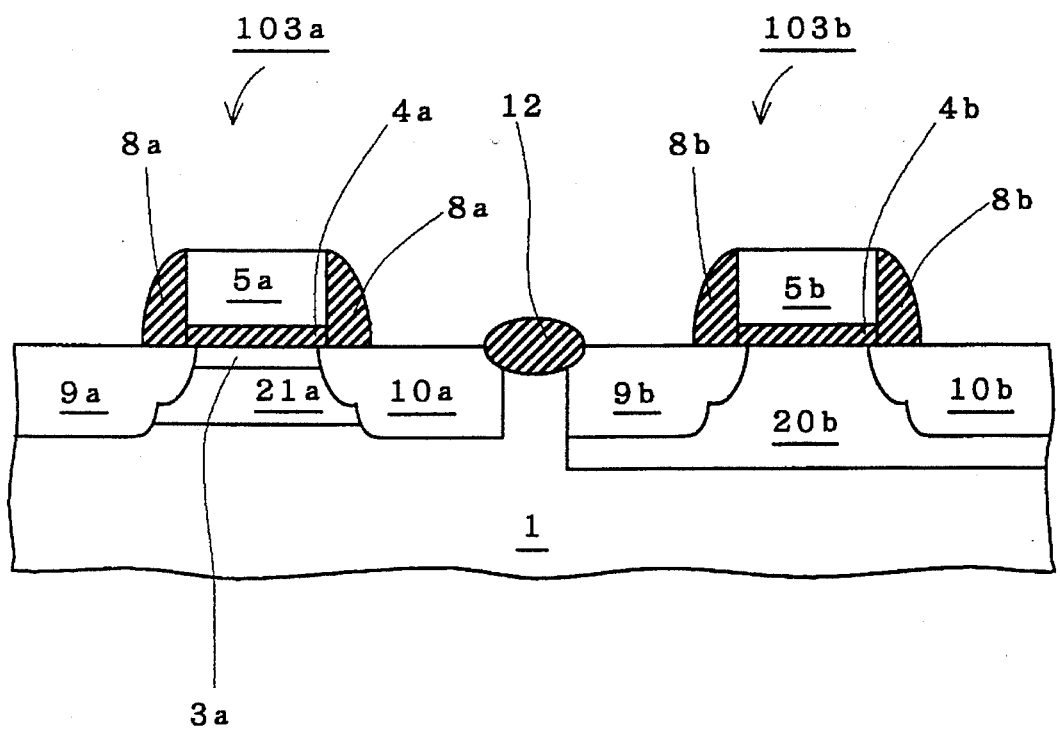
FIG. 21 is a cross-sectional view of a third preferred embodiment according to the present invention.

Third Preferred Embodiment:

FIG. 21 is a cross-sectional view of an NMOS transistor pair 103 including NMOS transistors 103a and 103b according to a third preferred embodiment of the present invention. The pair of NMOS transistors 103a and 103b are formed on the same well 1. The NMOS transistor 103a is of a buried channel type and has a lower threshold voltage than the NMOS transistor 103b of a surface channel type.

The NMOS transistor 103a includes a buried layer 3a, a gate oxide film 4a, a gate electrode 5a, sidewalls 8a, a source region 9a, and a drain region 10a which are respectively similar to the buried layer 3, the gate oxide film 4, the gate electrode 5, the sidewalls 8, the source region 9, and the drain region 10 of the NMOS transistor 101 of the first preferred embodiment.

FIGS. 22, 23, 25 and 26 are cross-sectional views showing a method of fabricating the NMOS transistor pair 103 in step-by-step fashion.

Figure 22:
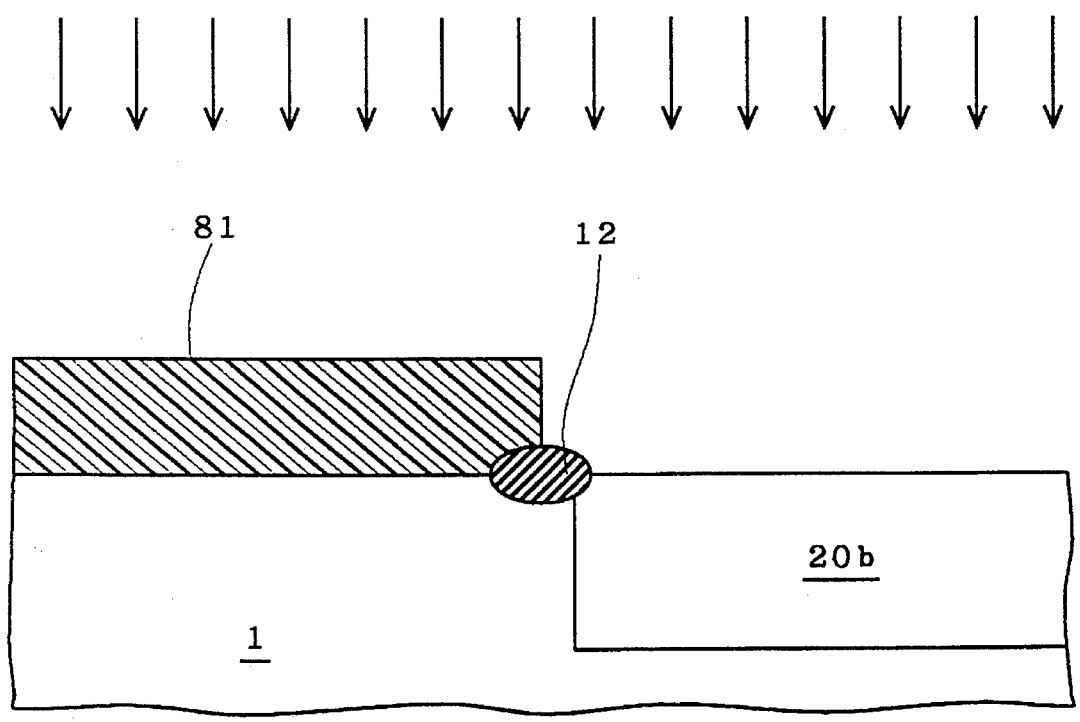
FIGS. 22, 23, 25 and 26 are cross-sectional views showing a fabrication process of the third preferred embodiment in step-by-step fashion according to the present invention.

First, the P-type semiconductor layer (well) 1 and a device isolation oxide film 12 are formed in the same manner as in the first preferred embodiment. A region in which the NMOS transistor 103a is to be formed is covered with a resist 81 and a region in which the NMOS transistor 103b is to be formed is exposed. Boron ions are implanted at 50 keV and $8 \times 10^{12}$ cm$^{-2}$ as indicated by the arrows of FIG. 22 to form a surface channel type punch-through stopper layer 20b (FIG. 22).

Figure 23:
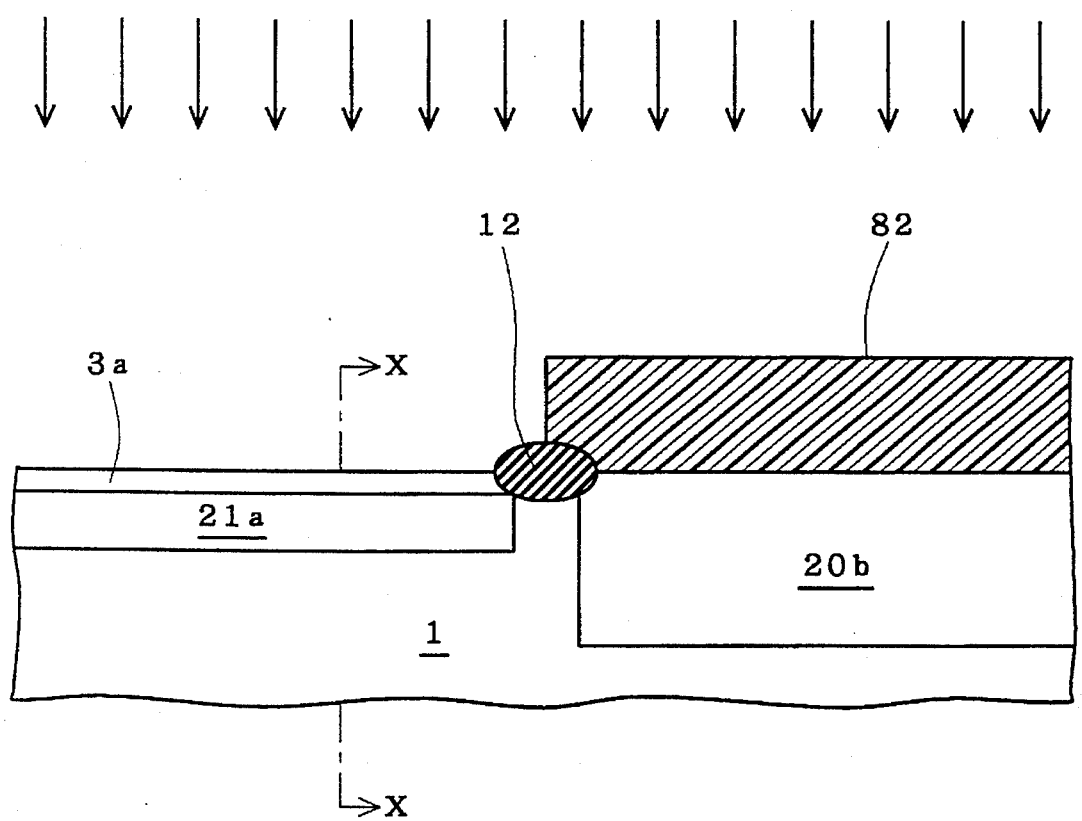

Then the region in which the NMOS transistor 103b is to be formed is covered with a resist 82 and the region in which the NMOS transistor 103a is to be formed is exposed. Boron ions are implanted at 15 keV and $8 \times 10^{12}$ cm$^{-2}$ as indicated by the arrows of FIG. 23 to form a buried channel type punch-through stopper layer 21a. The punch-through stopper layer 21a is shallower than the punch-through stopper layer 20b because of the magnitude of ion implantation energies. Arsenic ions are implanted at 20 keV and $6 \times 10^{12}$ cm$^{-2}$ to form the buried layer 3a (FIG. 23).

Figure 24:
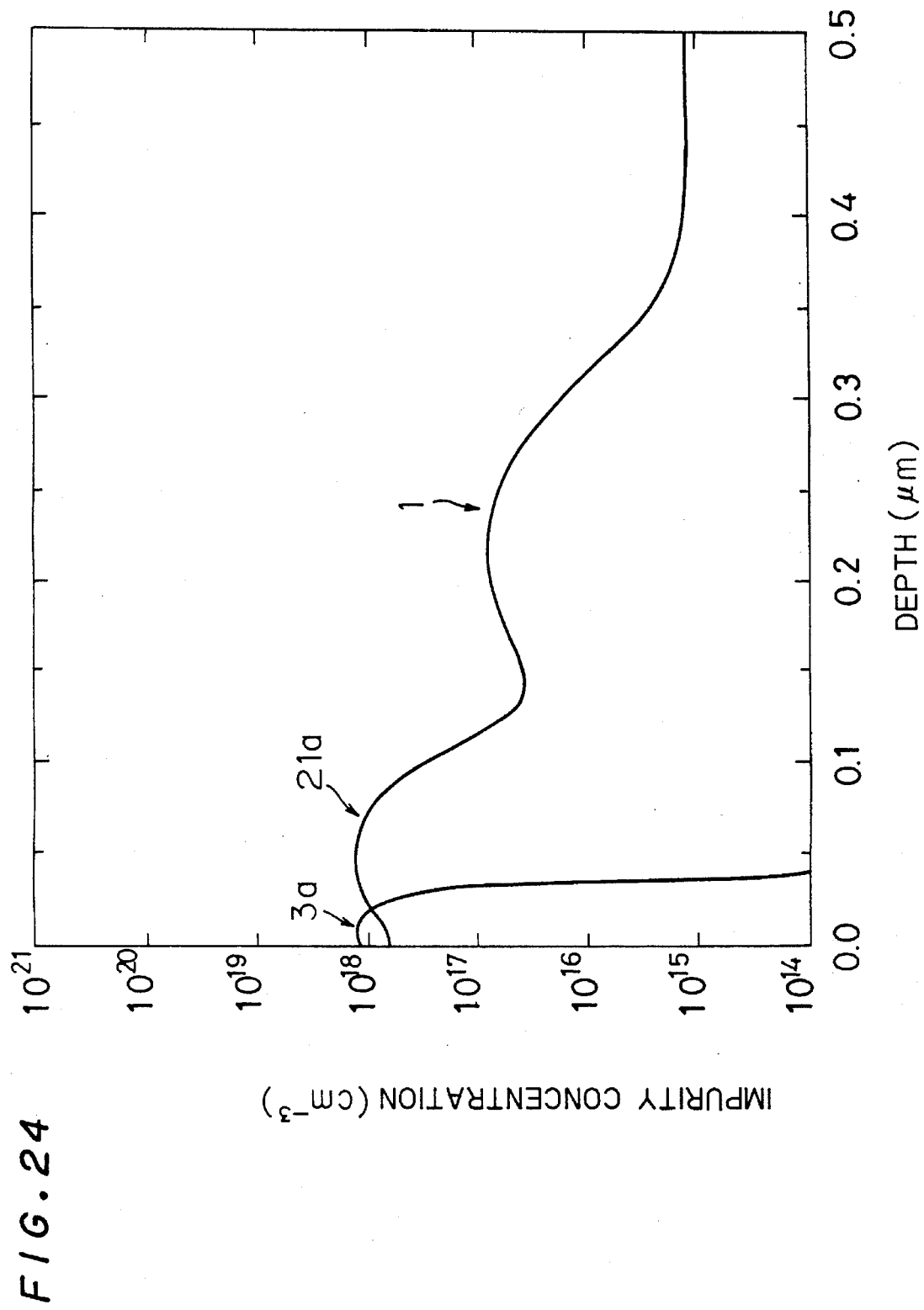
FIGS. 24 and 27 are graphs showing an impurity concentration of the third preferred embodiment according to the present invention.

FIG. 24 is a graph showing a profile of impurity concentration in section taken along the line X—X of FIG. 23. The boron doped to form the punch-through stopper layer 21a has a concentration peak at a depth of about 0.05 µm from the surface.

Figure 25:
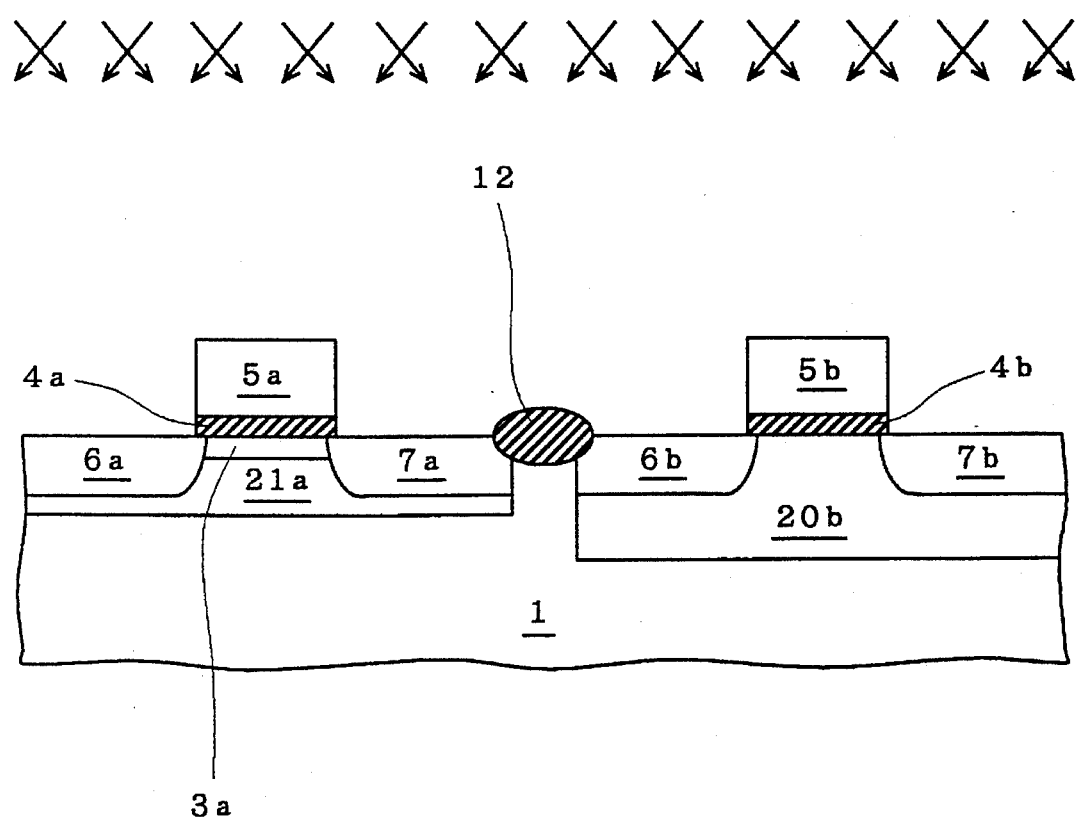

Then gate oxide films 4a, 4b and gate electrodes 5a, 5b are formed on the well 1. The gate electrodes 5a, 5b are made of, for example, N$^+$ polysilicon. Arsenic ions are implanted at an angle of 30 degrees at 30 keV and $5\times10^{12}$ cm$^{-2}$ using the gate electrodes 5a, 5b as a mask to form N$^-$ layers 6a, 6b, 7a, 7b serving as a basis of the LDD construction (FIG. 25). The N$^-$ layers 6a, 6b, 7a, 7b have an impurity concentration of about $1\times10^{17}$ to $5\times10^{18}$ cm$^{-3}$.

An oxide film of about 0.1 µm thickness is deposited by the CVD process and then anisotropically etched to form sidewalls 8a and 8b. Arsenic ions are implanted at 60 keV and $2\times10^{15}$ cm$^{-2}$ using the gate electrodes 5a, 5b and sidewalls 8a, 8b as a mask to form source regions 9a, 9b and drain regions 10a, 10b having the LDD construction (FIG. 26).

Figure 26:
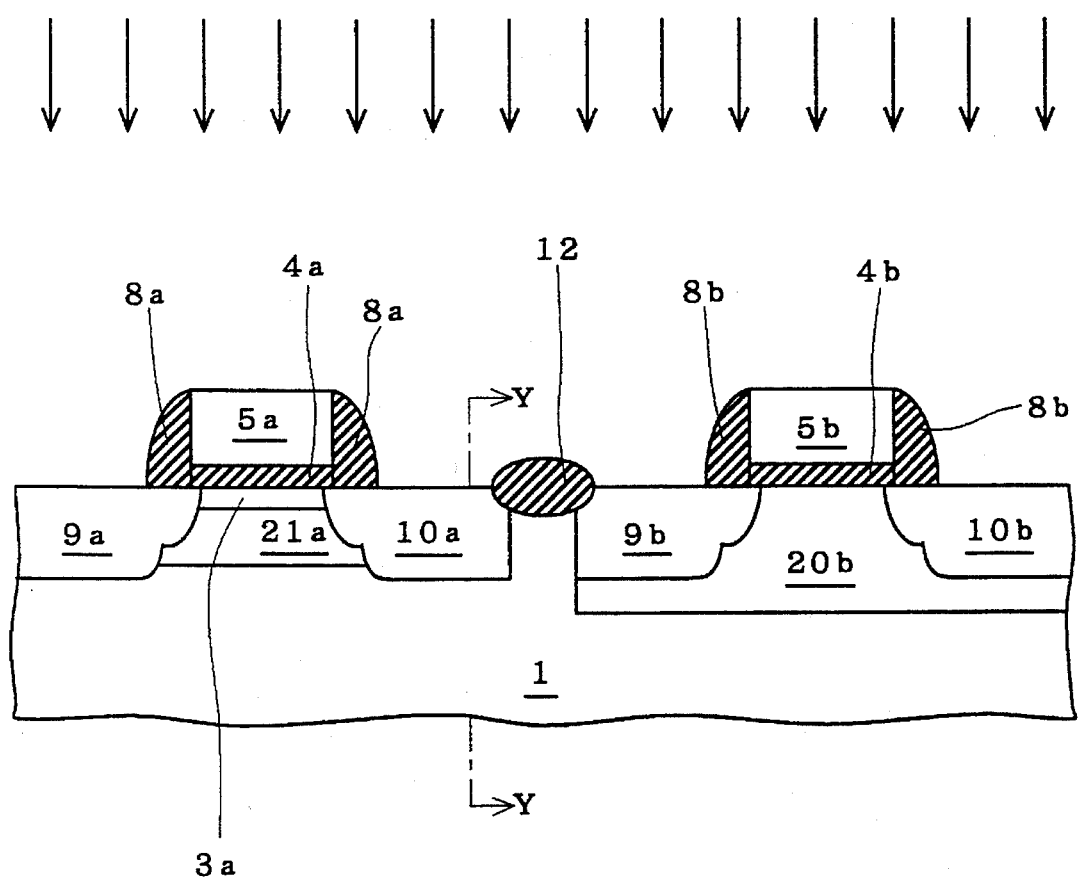
Figure 27:
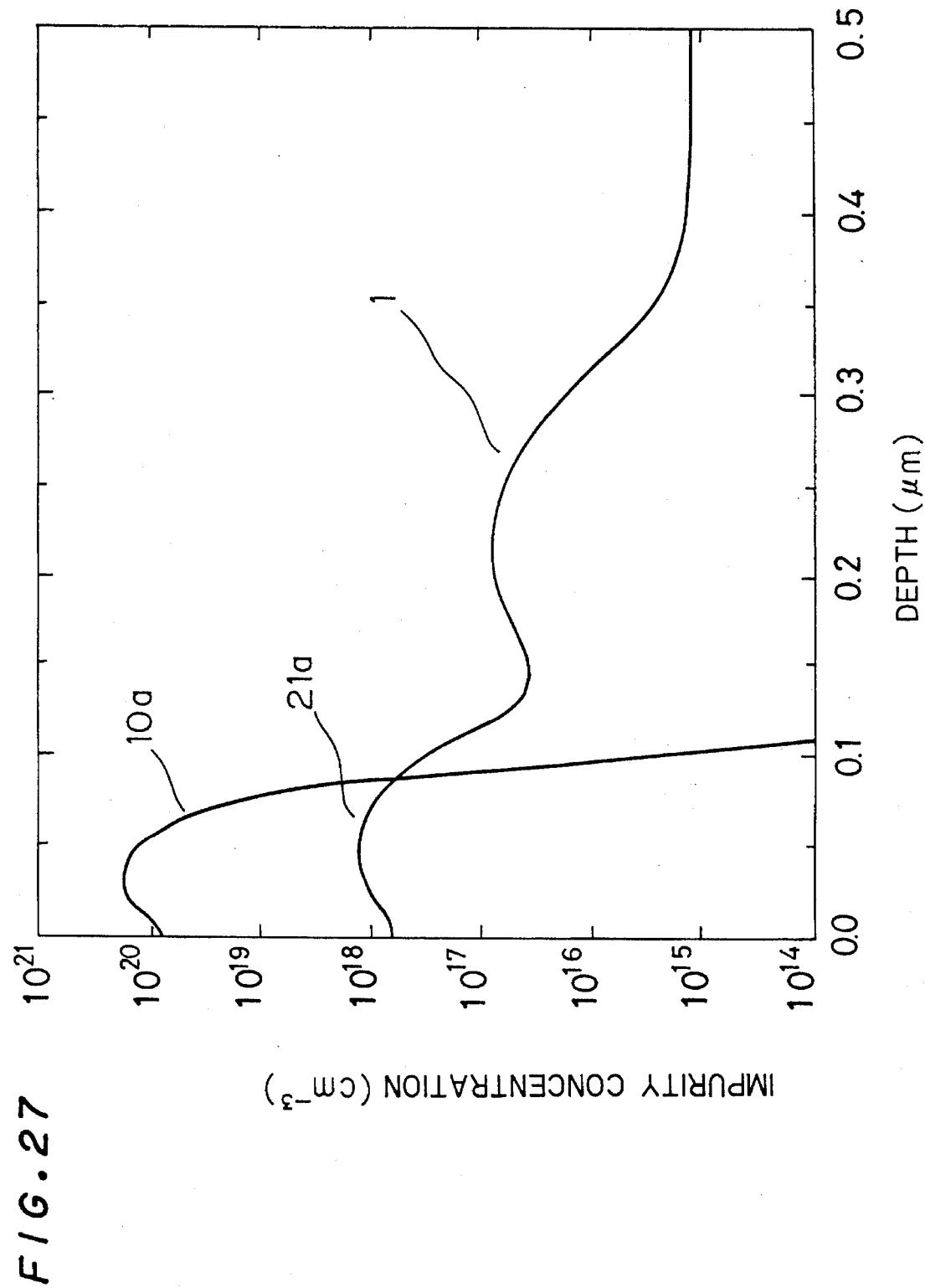

FIG. 27 is a graph showing a profile of impurity concentration in section taken along the line Y—Y of FIG. 26. The junction between the drain region 10a and punch-through stopper layer 21a is formed at a depth of about 0.1 µm. The peak of the boron doped to form the punch-through stopper layer 21a lies within the drain region 10a. Thus, the boron concentration at the junction may be reduced.

Figure 28:
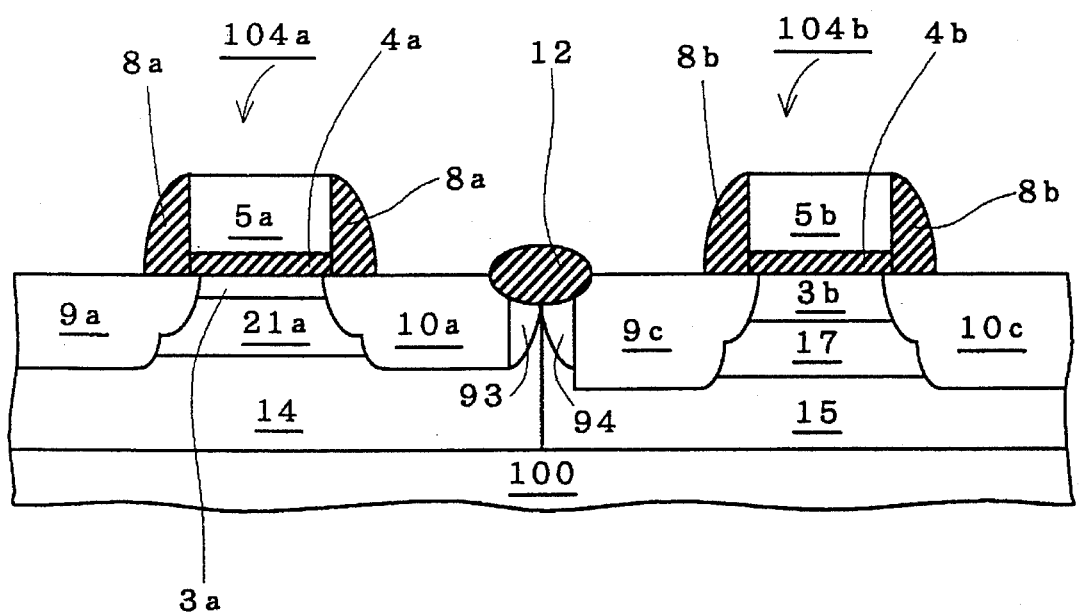
FIG. 28 is a cross-sectional view of a fourth preferred embodiment according to the present invention.

Fourth Preferred Embodiment:

FIG. 28 is a cross-sectional view of a CMOS transistor 104 according to a fourth preferred embodiment of the present invention. The CMOS transistor 104 includes a buried channel type NMOS transistor 104a and a buried channel type PMOS transistor 104b.

The NMOS transistor 104a is identical in construction with the NMOS transistor 103a of the third preferred embodiment. The PMOS transistor 104b includes a gate oxide film 4b, a gate electrode 5b, sidewalls 8b, a source region 9c, a drain region 10c, and a punch-through stopper layer 17 which are respectively similar to the gate oxide film 4b, the gate electrode 5b, the sidewalls 8b, the source region 9b, the drain region 10b, and the punch-through stopper layer 20b of the NMOS transistor 103b of the third preferred embodiment. However, the source region 9c, the drain region 10c, and the punch-through stopper layer 17 are of opposite conductivity type to the source region 9b, the drain region 10b, and the punch-through stopper layer 20b.

The NMOS transistor 104a and the PMOS transistor 104b are formed in a P-type well 14 and an N-type well 15, respectively.

FIGS. 29, 30, 32–35 and 37 are cross-sectional views showing a method of fabricating the CMOS transistor 104 in step-by-step fashion.

Figure 29:
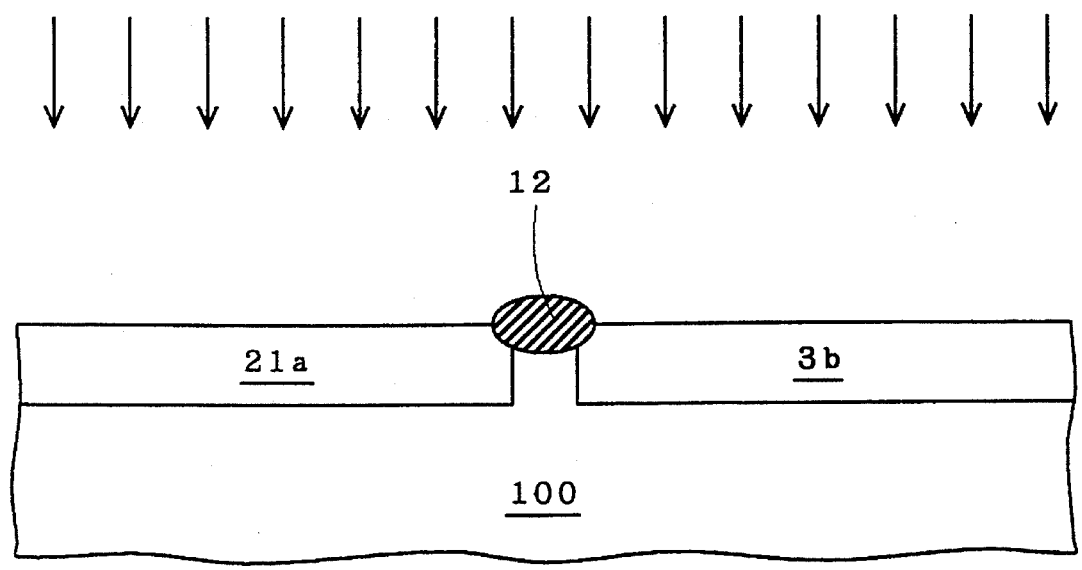
FIGS. 29, 30, 32–35 and 37 are cross-sectional views showing a fabrication process of the fourth preferred embodiment in step-by-step fashion according to the present invention.

The device isolation oxide film 12 is formed in a predetermined region of the silicon substrate 100. Boron ions are implanted at 15 keV and $8\times10^{12}$ cm$^{-2}$ to form the punch-through stopper layer 21a for the NMOS transistor 104a and a buried layer 3b for the PMOS transistor 104b simultaneously. The peaks of the punch-through stopper layer 21a and the buried layer 3b are at the same depth (FIG. 29).

A region in which the PMOS transistor 104b is to be formed is covered with a resist 83. Boron ions are implanted at 200 keV and $2\times10^{13}$ cm$^{-2}$ as indicated by the arrows of FIG. 30 to form the P-type well 14.

Boron ions are implanted at 80 keV and $5\times10^{12}$ cm$^{-2}$ to form a heavily doped region 93 under the device isolation oxide film 12. Arsenic ions are implanted at 20 keV and $6\times10^{12}$ cm$^{-2}$ to form the buried layer 3a (FIG. 30).

Figure 30:
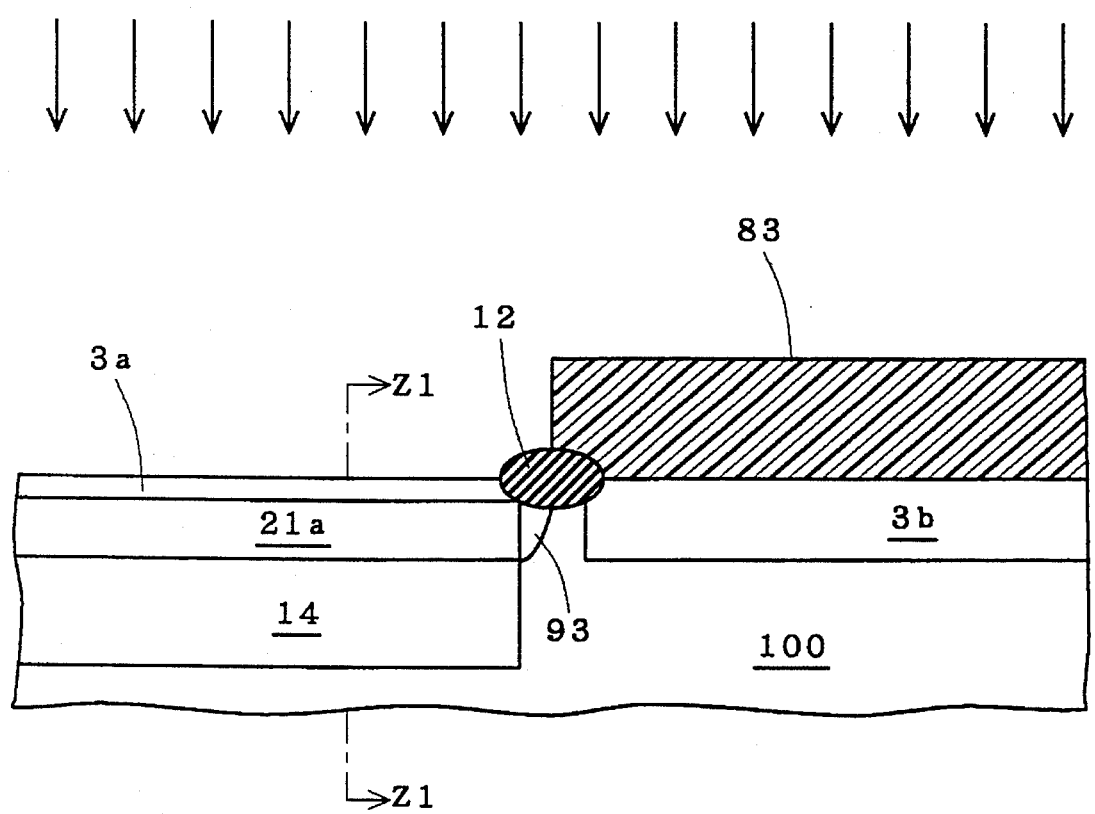
Figure 31:
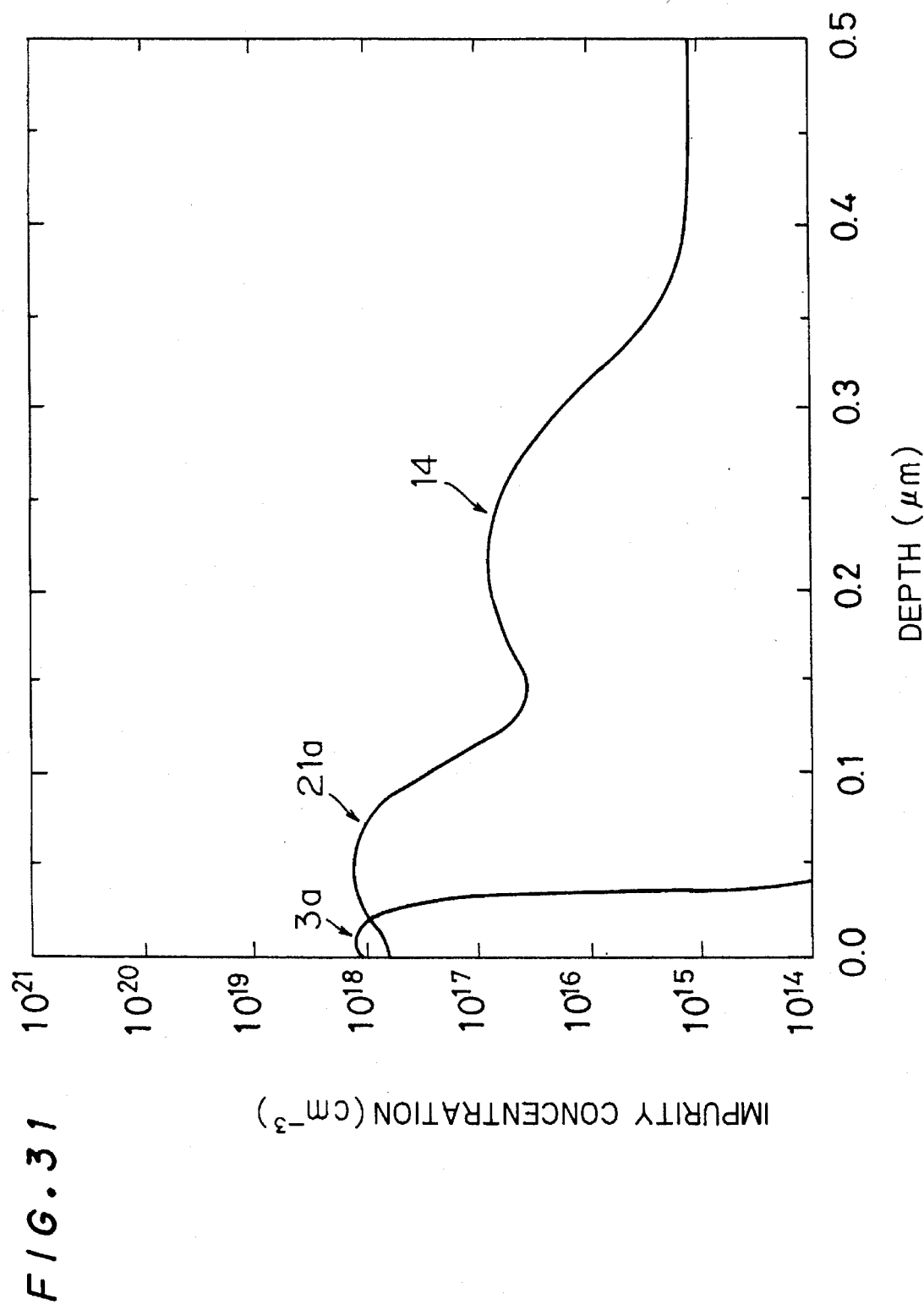
FIGS. 31 and 36 are graphs showing an impurity concentration of the fourth preferred embodiment according to the present invention.

FIG. 31 is a graph showing a profile of impurity concentration in section taken along the line Z1—Z1 of FIG. 30. The boron doped to form the punch-through stopper layer 21a has a concentration peak at a depth of about 0.05 µm from the surface.

Figure 32:
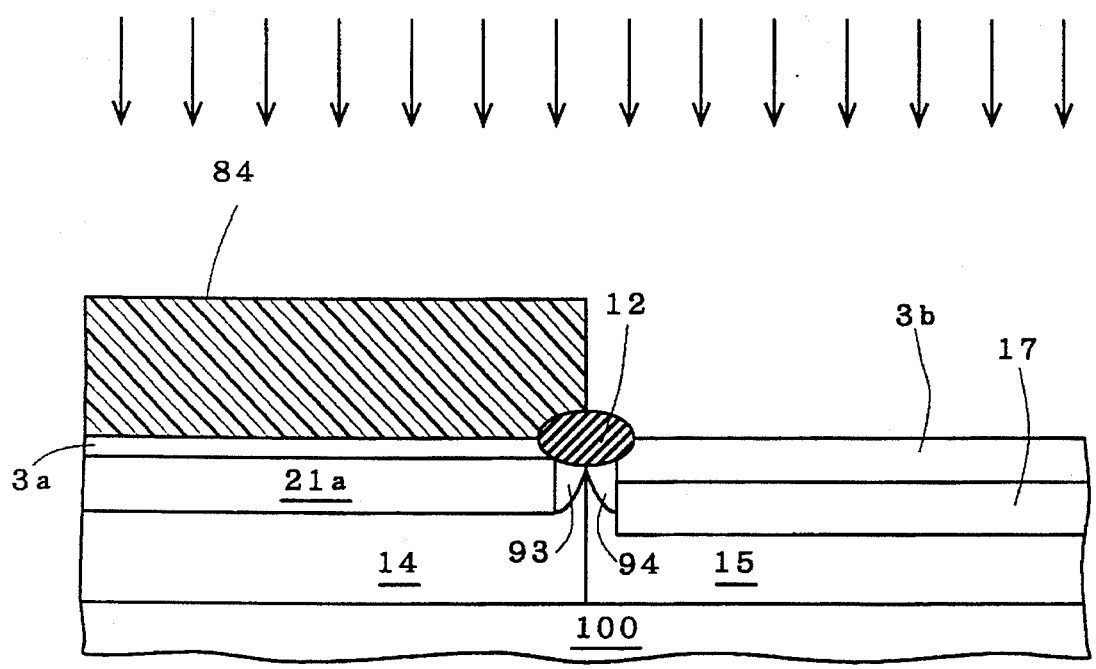

A region in which the NMOS transistor 104a is to be formed is covered with a resist 84. Phosphorus ions are implanted at 400 keV and $2\times10^{13}$ cm$^{-2}$ as indicated by the arrows of FIG. 32 to form the N-type well 15. Further, phosphorus ions are implanted at 250 keV and $5\times10^{12}$ cm$^{-2}$ to form a heavily doped region 94 under the isolation oxide film 12.

Phosphorus ions are further implanted at 80 keV and $6\times10^{12}$ cm$^{-2}$ to form the punch-through stopper layer 17. The formation of the punch-through stopper layer 17 decreases the effect of the impurities adjacent the bottom of the buried layer 3b to provide a shallow effective bottom thereof (FIG. 32).

Figure 33:
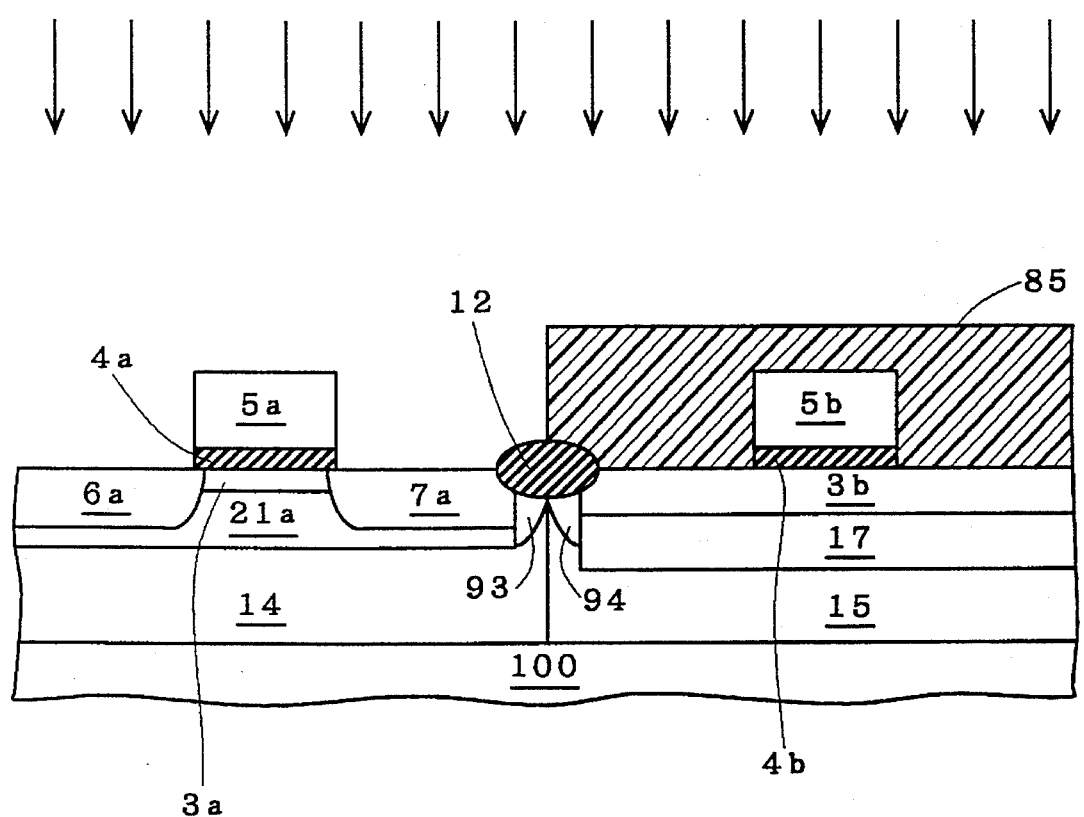

The gate oxide films 4a, 4b and the gate electrodes 5a, 5b are formed on the substrate 100. The region in which the PMOS transistor 104b is to be formed is covered with a resist 85. Arsenic ions are implanted at an angle of 30 degrees at 30 keV and $5\times10^{12}$ cm$^{-2}$ to form the N$^-$ layers 6a, 7a serving as a basis of the LDD construction (FIG. 33). The N$^-$ layers 6a, 7a have an impurity concentration of about $1\times10^{17}$ to $5\times10^{18}$ cm$^{-3}$.

Figure 34:
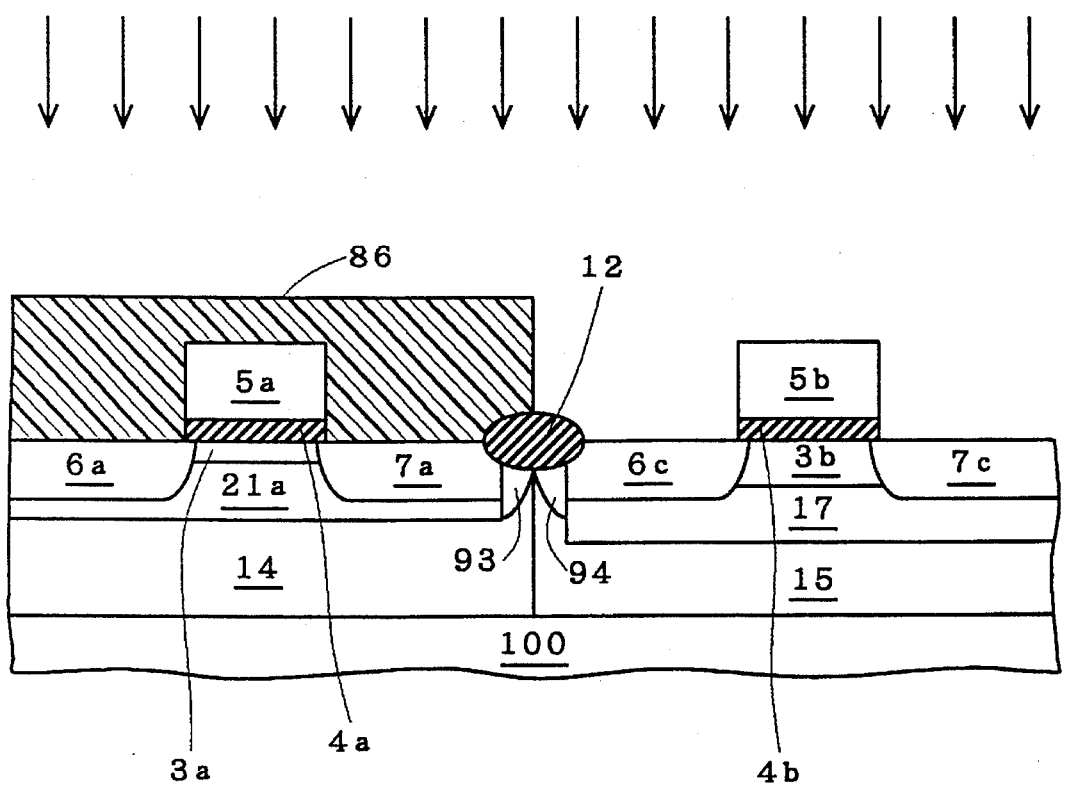

The region in which the NMOS transistor 104a is to be formed is covered with a resist 86. BF$_2$ ions are implanted at 10 keV and $5\times10^{12}$ cm$^{-2}$ to form P$^-$ layers 6c, 7c serving as a basis of the LDD construction. The P$^-$ layers 6c, 7c have an impurity concentration of about $1\times10^{17}$ to $5\times10^{18}$ cm$^{-3}$ (FIG. 34).

An oxide film having a thickness of about 0.1 µm is deposited by the CVD process and then anisotropically etched to form the sidewalls 8a, 8b. The region in which the PMOS transistor 104b is to be formed is covered with a resist 87. Arsenic ions are implanted at 60 keV and $2\times10^{15}$ cm$^{-2}$ to form the source region 9a and drain region 10a having the LDD construction (FIG. 35).

Figure 35:
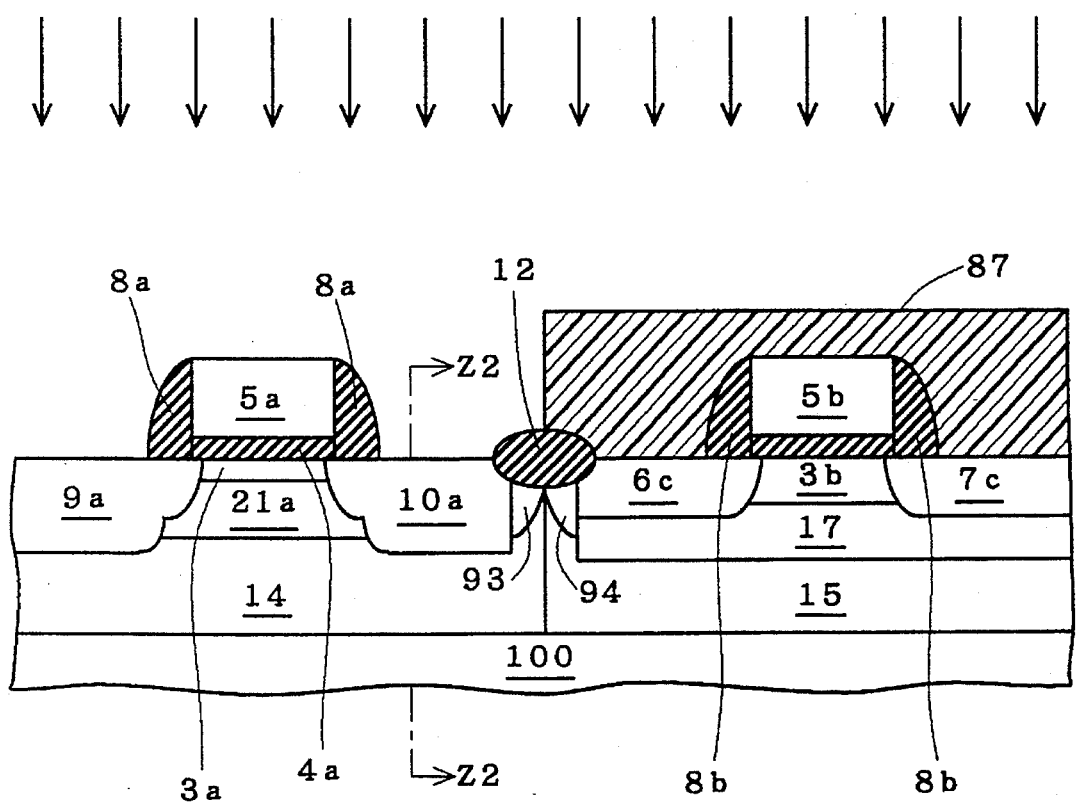
Figure 36:
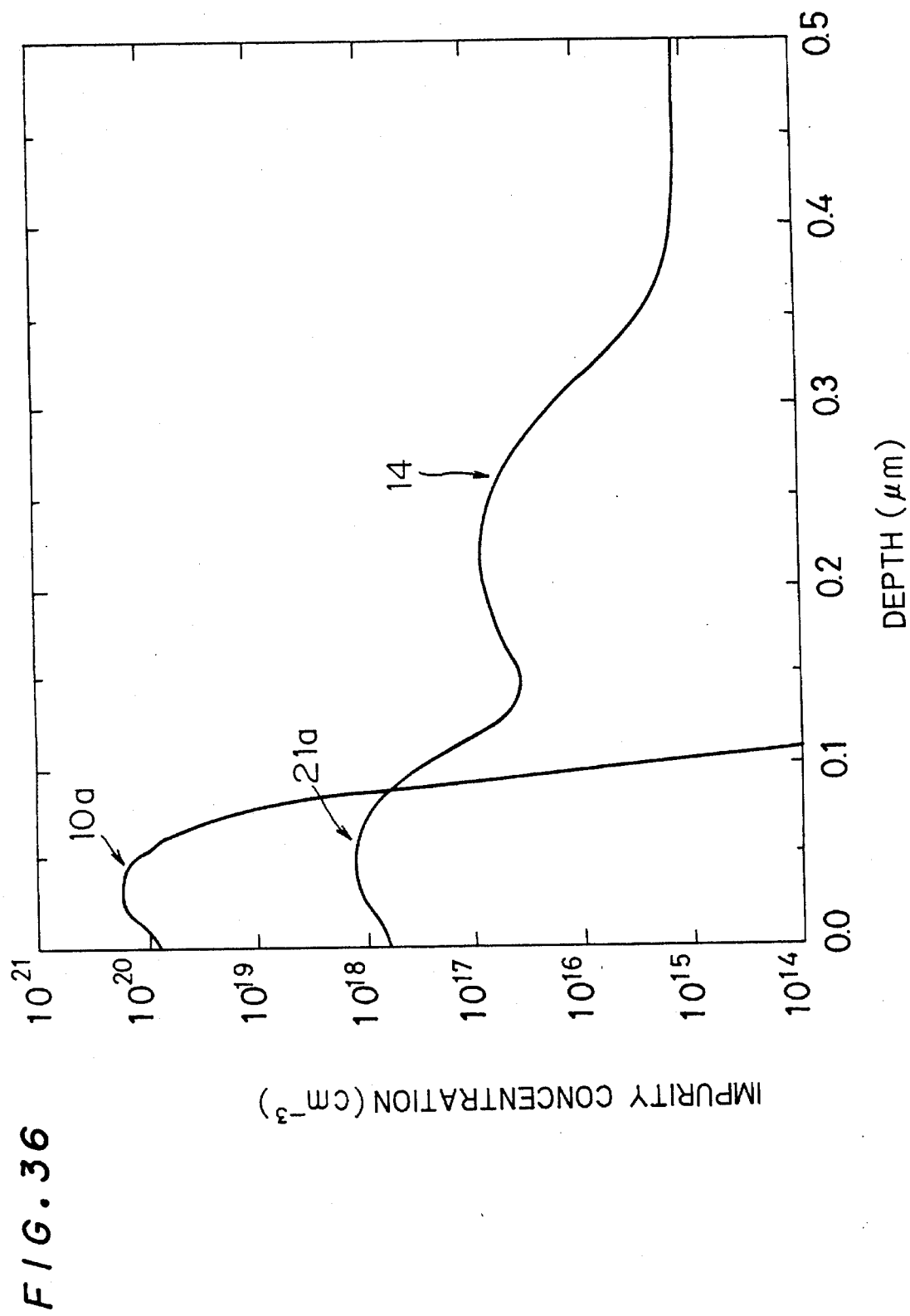

FIG. 36 is a graph showing a profile of impurity concentration in section taken along the line Z2—Z2 of FIG. 35. The junction between the drain region 10a and the punch-through stopper layer 21a is formed at a depth of about 0.1 µm. The peak of the boron doped to form the punch-through stopper layer 21a lies within the drain region 10a. Thus, the boron concentration at the junction may be reduced.

Figure 37:
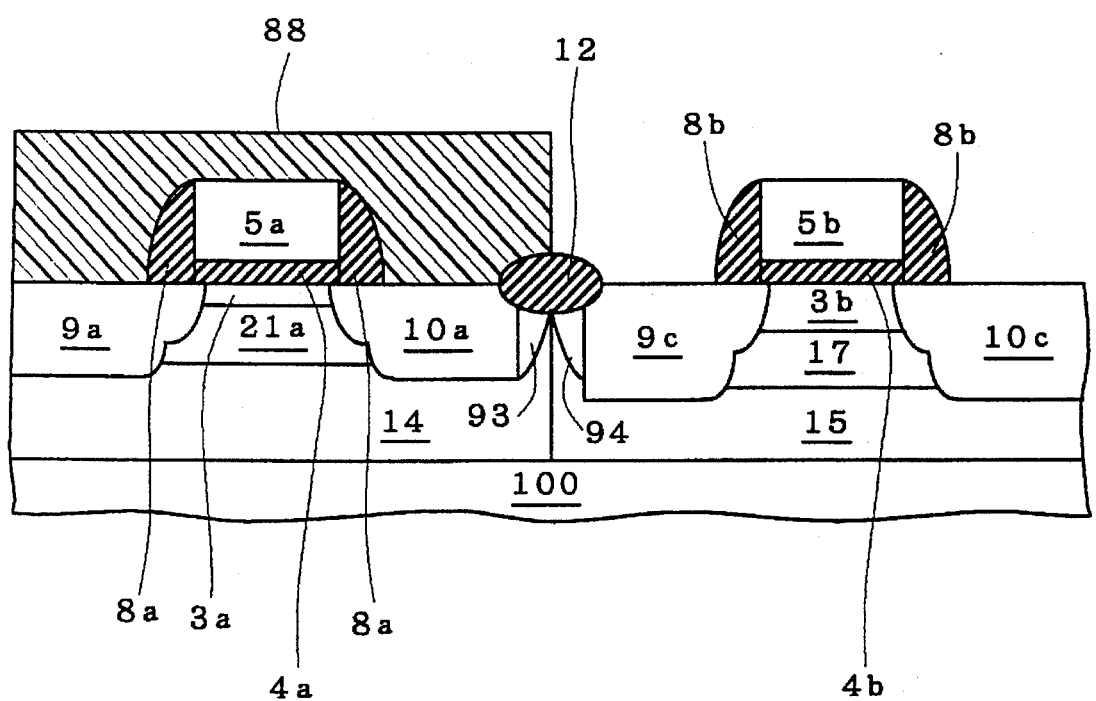
Figure 38:
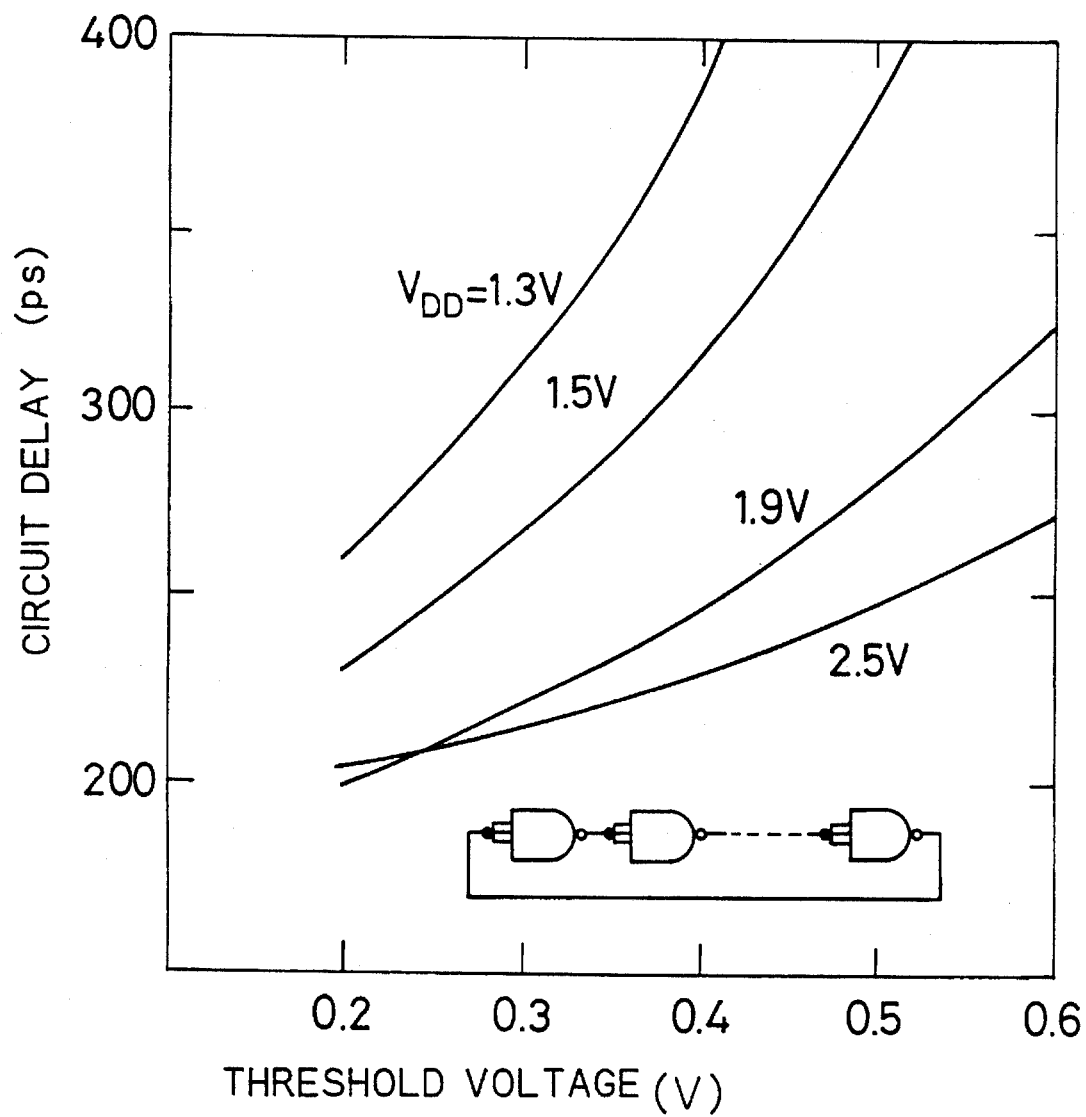
FIG. 38 is a graph showing the background art.
Figure 39:
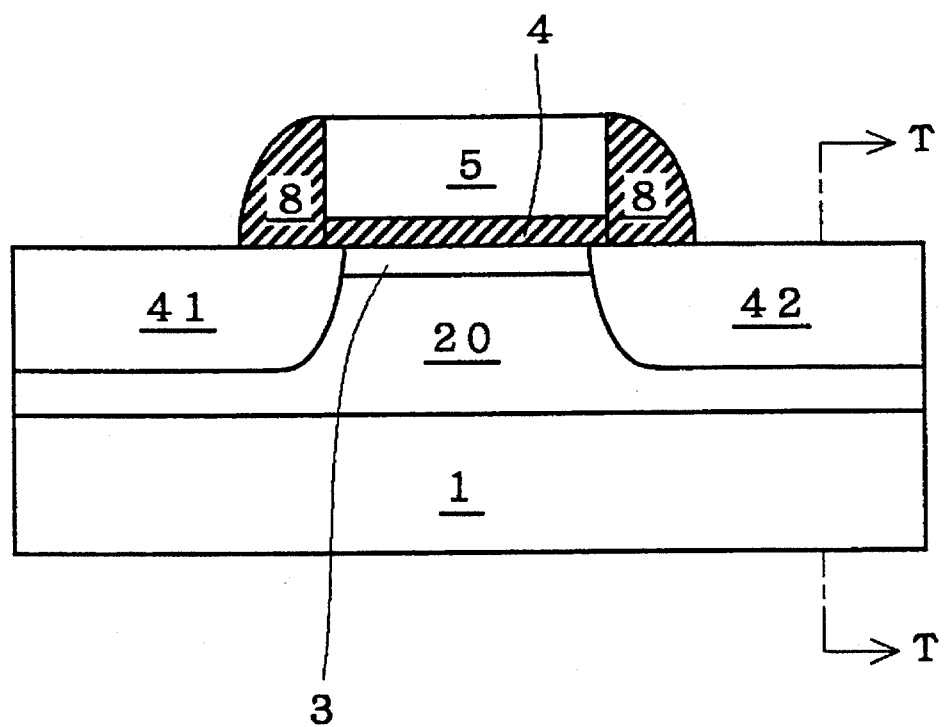
FIG. 39 is a cross-sectional view showing the background art.

The region in which the NMOS transistor 104a is to be formed is covered with a resist 88. BF$_2$ ions are implanted at 30 keV and $2\times10^{15}$ cm$^{-2}$ to form the source region 9c and drain region 10c having the LDD construction (FIG. 37).

In this manner, the fourth preferred embodiment of the present invention provides for simultaneous formation of the punch-through stopper layer 21a and the buried layer 3b, simplifying the process steps.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   (a) a semiconductor substrate including a first conductivity type impurity, said substrate having a first peak concentration of said first conductivity type impurity located along a depth direction of said semiconductor substrate;

(b) source and drain regions of a second conductivity type impurity selectively formed in an upper portion of said semiconductor substrate and including a concentration of said first conductivity type impurity, said source and drain regions making a pair to form an LDD construction said drain region having a second peak concentration of said first conductivity type impurity located along a depth direction of said drain region and said substrate; and (c) a buried layer formed in said upper portion of said semiconductor substrate between said source and drain regions, wherein a valley concentration of said first conductivity type impurity is located between said first peak concentration and said second peak concentration of the first conductivity type impurity.

2. A semiconductor device comprising:

(a) a semiconductor substrate having an upper surface; and (b) a first MOS transistor including:
  (b-1) source and drain regions including a concentration of a first conductivity type impurity and a lesser concentration of a second conductivity type impurity selectively formed in said upper surface of said semiconductor substrate and making a pair to form an LDD construction said drain region having a bottom;
  (b-2) a first punch-through stopper layer including a concentration of a second conductivity type impurity formed in said upper surface of said semiconductor substrate between said source and drain regions, a peak of the concentration of the second conductivity type impurity of said first punch-through stopper layer being closer to said upper surface of said semiconductor substrate than the bottom of said drain region wherein said bottom of said drain region is located at a depth along a depth direction of said drain region where the concentration of the first conductivity type impurity equals the concentration of the second conductivity type impurity;
  (b-3) a buried layer formed in an upper portion of said first punch-through stopper layer;
  (b-4) a gate oxide film formed on said buried layer; and
  (b-5) a gate electrode opposed to said buried layer, with said gate oxide film therebetween.

3. The semiconductor device of claim 2, wherein said first MOS transistor further includes (b-6) a second punch-through stopper layer disposed under said bottom of said drain region and said first punch-through stopper layer, and being of the same conductivity type as said first punch-through stopper layer and having an impurity concentration lower than that of said first punch-through stopper layer.

4. The semiconductor device of claim 2, further comprising (c) a surface channel type second MOS transistor of the same conductivity type as said first MOS transistor and formed on said semiconductor substrate.

5. The semiconductor device of claim 2, further comprising:

(c) a second MOS transistor of opposite conductivity type to said first MOS transistor, said second MOS transistor including:
  (c-1) source and drain regions selectively formed in said upper surface of said semiconductor substrate and making a pair to form to an LDD construction;
  (c-2) a punch-through stopper layer formed in said upper surface of said semiconductor substrate between said source and drain regions of said second MOS transistor, a peak of a concentration of a first conductivity type impurity concentration of said punch-through stopper layer of said second MOS transistor being closer to said upper surface of said semiconductor substrate than the bottom of said drain region of said second MOS transistor said bottom of said drain region is located at a depth along a depth direction of said drain region of said second MOS transistor where the concentration of the first conductivity type impurity equals a concentration of a second conductivity type impurity;
  (c-3) a buried layer formed in an upper portion of said punch-through stopper layer of said second MOS transistor said buried layer having a peak of a second conductivity type impurity concentration;
  (c-4) a gate oxide film formed on said buried layer of said second MOS transistor; and
  (c-5) a gate electrode opposed to said buried layer of said second MOS transistor, with said gate oxide film of said second MOS transistor therebetween, and wherein the peak of the second conductivity type impurity concentration of said buried layer of said second MOS transistor is at the same depth as a peak of the impurity concentration of said first punch-through stopper layer of said first MOS transistor.

* * * * *